United States Patent [19]
Cushner et al.

[11] Patent Number: 5,916,403
[45] Date of Patent: Jun. 29, 1999

[54] METHODS AND APPARATUS FOR FORMING CYLINDRICAL PHOTOSENSITIVE ELEMENTS

[75] Inventors: Stephen Cushner, Lincroft; Roxy Ni Fan, E. Brunswick, both of N.J.; Edward Andrew Calisto, Hockessin, Del.; Daniel Francis Sheehan, Jr., Cliffwood Beach, N.J.

[73] Assignee: E. I. du Pont de Nemours and Company, Wilmington, Del.

[21] Appl. No.: 09/006,981

[22] Filed: Jan. 14, 1998

Related U.S. Application Data

[62] Division of application No. 08/536,579, Sep. 29, 1995, Pat. No. 5,798,019.

[51] Int. Cl.[6] .......................... B29C 47/00; B29D 23/00
[52] U.S. Cl. .................. 156/244.13; 156/425; 156/429; 156/448; 156/244.11; 264/DIG. 68; 264/310; 493/337; 493/269; 493/338
[58] Field of Search ...................... 156/187, 189, 156/195, 244.11, 244.13, 244.24, 244.27, 191, 194, 446, 448, 449, 450, 425, 429; 493/337, 338, 395, 269, 303, 304, 305, 306, 293, 272–274; 264/310, DIG. 68

[56] References Cited

U.S. PATENT DOCUMENTS

| | | | |
|---|---|---|---|
| 3,146,709 | 9/1964 | Bass et al. | 101/375 |
| 4,178,200 | 12/1979 | Hakert et al. | 156/187 |
| 4,298,680 | 11/1981 | Bruno | 430/300 |
| 4,337,220 | 6/1982 | Arimatsu | 264/25 |
| 4,381,961 | 5/1983 | van der Velden | 156/215 |
| 4,389,116 | 6/1983 | Vogel | 355/85 |
| 4,391,898 | 7/1983 | van der Velden | 430/306 |
| 4,554,040 | 11/1985 | van der Velden | 156/215 |
| 4,601,928 | 7/1986 | van der Velden | 428/36 |
| 4,758,500 | 7/1988 | Schober et al. | 430/309 |
| 4,868,090 | 9/1989 | Kitamura et al. | 430/271 |
| 4,869,997 | 9/1989 | Koch et al. | 430/300 |
| 4,871,650 | 10/1989 | Wallbillich et al. | 430/300 |
| 4,883,742 | 11/1989 | Wallbillich et al. | 430/275 |
| 4,903,597 | 2/1990 | Hoage et al. | 101/401.1 |
| 5,041,359 | 8/1991 | Johannes | 430/300 |
| 5,041,360 | 8/1991 | Schlosser | 430/309 |
| 5,094,660 | 3/1992 | Okuzawa | 493/395 |
| 5,260,166 | 11/1993 | Nazzaro et al. | 430/271 |
| 5,301,610 | 4/1994 | McConnell | 101/401.1 |

FOREIGN PATENT DOCUMENTS

| | | | |
|---|---|---|---|
| 0 440 079 A2 | 8/1991 | European Pat. Off. | G03F 7/18 |
| 0 469 375 A2 | 2/1992 | European Pat. Off. | G03F 7/18 |
| 0 469 375 A3 | 2/1992 | European Pat. Off. | G03F 7/16 |
| 1 579 817 | 11/1980 | United Kingdom | G03F 7/10 |
| 2 107 479 | 10/1984 | United Kingdom | G03C 1/00 |
| 2 280 391 | 2/1995 | United Kingdom | B05C 5/02 |

OTHER PUBLICATIONS

Article, SEAMEX, A Name Worth Repeating, Design and Production by OEC Graphics, Inc.

Article, Seamless Sleeves Fill a Market Gap, by Durk Schilstra, EFM, Jun. 1991.

*Primary Examiner*—James F. Coan
*Assistant Examiner*—Gene L. Kim
*Attorney, Agent, or Firm*—Thomas H. Magee

[57] ABSTRACT

The present invention relates to methods and apparatus for forming seamless cylindrical photosensitive elements of uniform thickness on flexible sleeves. The apparatus for forming a seamless cylindrical photosensitive element of uniform thickness on a flexible sleeve, comprises a mandrel, a mandrel support assembly, a calendering assembly, a drive system and at least a heating element. The methods comprise forming seamless cylindrical photosensitive elements of uniform thickness on flexible sleeves from a stream of molten photopolymerizable material, or a solid or molten sheet of photopolymerizable material. The seamless cylindrical photosensitive elements are formed on polyester sleeves for use on a printing cylinder.

7 Claims, 9 Drawing Sheets

METHODS AND APPARATUS FOR FORMING CYLINDRICAL PHOTOSENSITIVE ELEMENTS

This is a division of application Ser. No. 08/536,579 filed Sep. 29, 1995, now U.S. Pat. No. 5,798,019.

BACKGROUND OF THE INVENTION

1. Field of the Invention

This invention relates to methods and apparatus for forming seamless cylindrical photosensitive elements of uniform thickness on flexible sleeves and, in particular, to methods and apparatus for forming seamless cylindrical photosensitive elements of uniform thickness on flexible sleeves without sanding, grinding or additional polishing apparatus.

2. Description of Related Art

Flexographic printing plates are well known for use in printing, particularly on surfaces which are soft and easily deformable, such as packaging materials, e.g., cardboard, plastic films, etc. Flexographic printing plates can be prepared from photopolymerizable compositions, such as those described in U.S. Pat. Nos. 4,323,637 and 4,427,749. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, polymerization, and hence, insolubilization of the photopolymerizable layer occurs in the exposed areas. Treatment with a suitable solvent removes the unexposed areas of the photopolymerizable layer leaving a printing relief which can be used for flexographic printing.

The flexographic photopolymerizable compositions can be formed into sheets or layers by several known methods such as solvent casting, hot pressing, calendering and extrusion. A preferred method of manufacturing flexographic printing elements is by extrusion calendering of the photopolymerizable composition. In extrusion calendering, the printing element is prepared by passing a mass of hot photopolymerizable material into an extrusion die forming a layer, passing the layer into the nip of a calender and, while still hot, calendering the photopolymerizable composition between two flat surfaces, generally two flexible films, to form a multilayer web. The films can include multiple layers or compound films. A film bearing a thin layer of flexible, polymeric material is an example of a compound film. After extrusion and calendering at elevated temperatures, the web is held in tension in the machine direction by a pair of nip rollers while the multilayer web is cooled, for example, with blown air. The printing element as a multilayer web can be cut into suitable size sheets. Extrusion and calendering of polymeric compositions are disclosed, for example, in Gruetzmacher et al., U.S. Pat. No. 4,427,759; and in Min, U.S. Pat. No. 4,622,088.

Although typically photopolymeric printing elements are used in sheet form, there are particular applications and advantages to using the printing element in a continuous cylindrical form. Continuous printing elements have applications in the flexographic printing of continuous designs such as in wallpaper, decoration and gift wrapping paper. Furthermore, such continuous printing elements can be well-suited for mounting on laser exposure equipment where it can replace the drum or be mounted on the drum for laser exposure as disclosed in U.S. Pat. No. 5,223,359 and U.S. patent application Ser. No. 08/432,411.

The formation of "seamless," continuous printing elements can be accomplished by several methods. The photopolymerizable flat sheet elements can be reprocessed by wrapping the element around a cylindrical form, usually a printing sleeve or the printing cylinder itself, and fusing or joining the edges together to form a seamless, continuous element. Processes for joining the edges of a plate into a cylindrical form have been disclosed, for example, in German patent DE 28 44 426, United Kingdom patent GB 1 579 817, and U.S. Pat. No. 4,758,500. A problem with the prior methods of joining the edges to form the continuous cylinder is that the results of printing with the joined cylinder are often unsatisfactory, particularly when the joined edge falls within the effective printing area of the plate. The joined seam is visible in and interrupts the printed image.

Further, photosensitive resin cylinders are also made from a layer of photopolymeric composition by a Seamex process. The Seamex process involves wrapping a layer of photopolymeric material to a nickel sleeve having a heat-activated primer coat to bond with the material so that the ends of the plate are joined together. The entire assembly is placed in an oven to cure and bond the photopolymeric layer to the primer coat and melt ends of the photopolymeric layer together. The photopolymeric layer on the sleeve is then ground to the necessary thickness, wiped clean and sprayed with a protective coating to prevent negatives from sticking to the photopolymer during exposure. The process of wrapping, curing and melting, grinding and spraying the photopolymeric layer to the sleeve takes about 1.5 to 2 days to accomplish. The cylindrical photopolymeric layer on the sleeve then undergoes the steps of imagewise exposure to polymerize those areas of the layer exposed to light, and processing to wash away the unpolymerized areas of the layer on the cylinder, forming a relief surface for printing.

Also, U.S. Pat. No. 4,337,220 discloses a process for preparing photosensitive resin cylinders which comprises winding a photosensitive resin sheet on and around the surface of a cylinder without any material overlapping of or spaces between the edge portions of the wound resin sheet, and applying to the cylinder under rotation a roll rotating in contact with the surface of the resin sheet while heating. The edge portions of the resin sheet join to one another by melting and the thickness of the resin sheet is made uniform. Preferably, the photosensitive resin sheet is wound on the cylinder with the aid of adhesive tape or agent. The resin sheet while on the cylinder is heated only in an amount sufficient for softening the resin sheet to avoid flowing of the resin because the flowing resin adheres to the roll or hangs down to make the control of the film thickness difficult.

SUMMARY OF THE INVENTION

The invention relates to an apparatus for forming a seamless cylindrical photosensitive element on a flexible sleeve, comprising:

a mandrel having a longitudinal axis, a first end and a second end, the mandrel for supporting the sleeve in a substantially cylindrical shape such that the sleeve is rotatable with or about the mandrel;

a mandrel support assembly for supporting at least the first end of the mandrel;

a calendering assembly for metering a substantially cylindrical molten stream, or a molten or solid sheet, of photopolymerizable material on the sleeve to have a substantially constant thickness;

a drive system for moving the sleeve around and along the longitudinal axis of the mandrel in a helical fashion so that the calendering assembly polishes an outer circumferential surface of the element to a seamless uniform state without sanding, grinding or additional polishing apparatus; and at least a heating element for heating the photopolymerizable material while the element is being formed.

The invention further relates to a method for forming a seamless cylindrical photosensitive element on a flexible cylindrical sleeve, comprising:

supplying a substantially cylindrical molten stream, or a molten or solid sheet, of photopolymerizable material onto the sleeve supported by a mandrel;

calendering the molten photopolymerizable material on the sleeve by metering the photopolymerizable material to have a substantially constant thickness on the sleeve;

moving the sleeve around and along the longitudinal axis of the mandrel in a helical fashion to polish an outer circumferential surface of the element to a seamless uniform state without sanding, grinding or additional polishing apparatus, thereby forming the seamless cylindrical photosensitive element; and during the calendering step, heating the photopolymerizable material.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Figure 1:
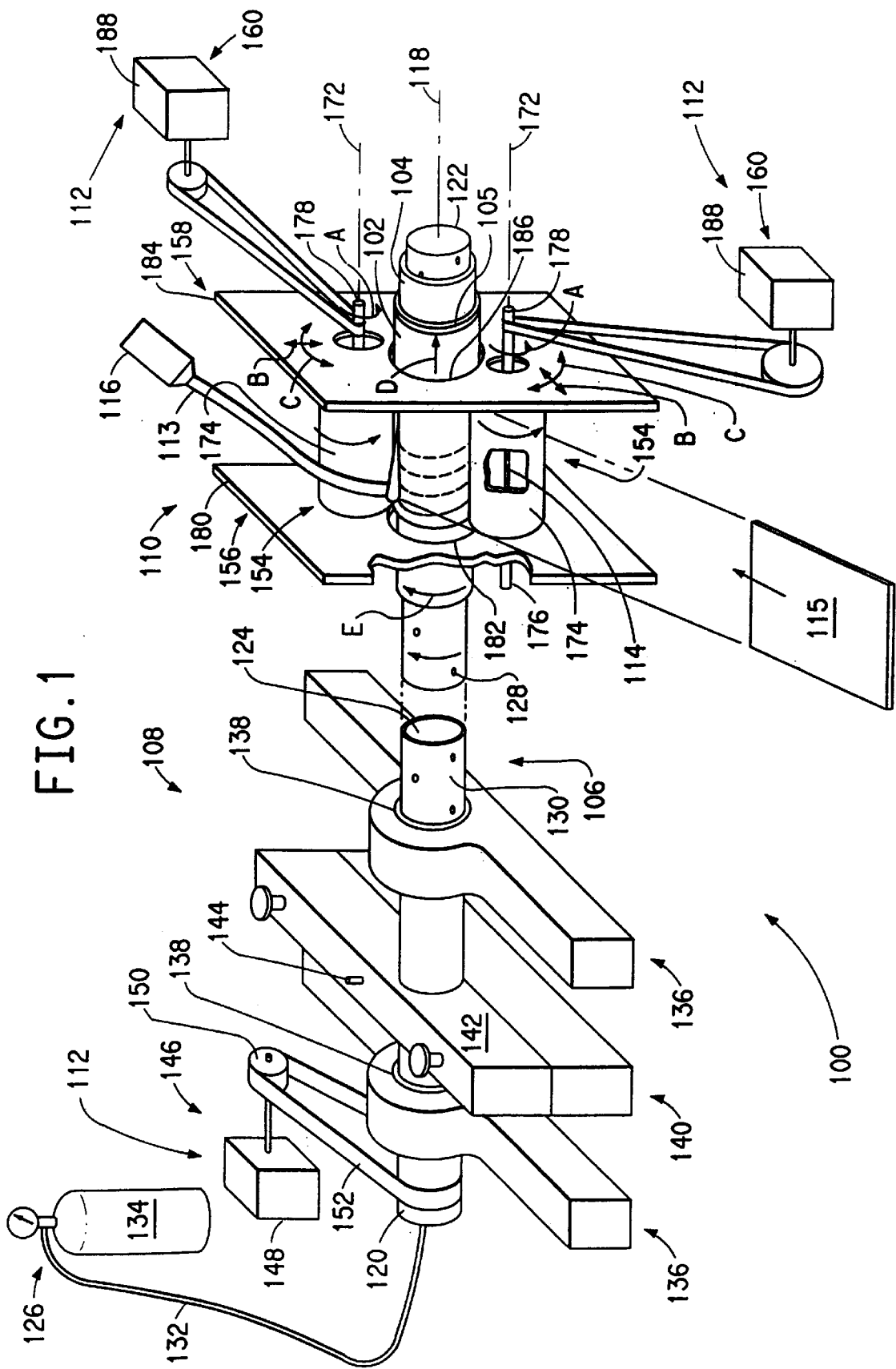
FIG. 1 is a schematic isometric view of an apparatus for forming the cylindrical photosensitive element from a stream of molten photopolymer or a sheet of photosensitive material in accordance with the invention.

Throughout the following detailed description, similar reference characters refer to similar elements in all figures of the drawings.

Referring to FIG. 1, there is a schematic illustration of an apparatus 100 for forming a seamless cylindrical photosensitive element 102 of uniform thickness on a flexible sleeve 104 in accordance with the invention. The forming apparatus 100 comprises a mandrel 106, a mandrel support assembly 108, a calendering assembly 110, a drive system 112, and at least a heating element 114. The forming apparatus 100 is capable of operating in a first mode and a second mode. In the first operating mode, the forming apparatus 100 forms a seamless cylindrical photosensitive element 102 of uniform thickness in a helical fashion on a flexible sleeve 104 from a cylindrical stream 113 of molten photopolymerizable material, such as, supplied from a line 116 from an extruder. In the second operating mode, the forming apparatus 100 forms a seamless cylindrical photosensitive element 102 of uniform thickness on a flexible sleeve 104 from a sheet 115 of solid or molten photopolymerizable material. In the second mode, the molten sheet 115 can be supplied from a die connected by a line to an extruder. In the second mode, the molten or solid sheet 115 can be fed into the apparatus 100 such that the resulting seamless cylindrical photosensitive element 102 is or is not formed in a helical fashion.

Mandrel

The mandrel 106 is a cylindrical shaft for supporting the flexible sleeve 104 in a substantially cylindrical shape while the photosensitive element 102 is formed on the sleeve 104. The mandrel 106 has a longitudinal axis 118, a first end 120 and a second end 122. The forming apparatus 100 can be adapted to use different mandrels, each having an outer cylindrical surface with a different outer diameter. Preferably, the outer diameter of the mandrel 106 is from about 5 cm to about 72 cm. Preferably, the mandrel 106 is hollow having an internal cavity 124. In the first operating mode, the mandrel 106 can be rotatable, but is preferably non-rotatable. In the second operating mode, the mandrel 106 can be rotatable or non-rotatable. If the mandrel 106 is rotatable, the sleeve 104 rotates with the mandrel 106. If the mandrel 106 is non-rotatable, the sleeve 104 rotates about the mandrel 106.

Pneumatic System

Optionally, a pneumatic system 126 can be provided for supplying air through passages 128 through the mandrel 106 to an outer circumferential surface 130 of the mandrel 106 to facilitate movement of the sleeve 104 axially along and rotationally about the mandrel 106. The pneumatic system 126 can comprise a line 132 from a pressurized air source or generator 134 connected to one of the ends of the mandrel 106 through a rotatable air tight connection (not depicted) to supply pressurized air to the mandrel cavity 124. The passages 128 can extend radially through the mandrel 106 from the interior cavity 124 to the mandrel outer cylindrical surface 130. Alternatively, the pneumatic system 126 can include an air manifold system like the one disclosed in U.S. Pat. No. 5,301,610. If the mandrel 106 is rotatable, the air manifold system can be connectable to the pressurized air source through a rotatable air tight connection.

Mandrel Support Assembly

The mandrel support assembly 108 supports at least the first end 120 of the mandrel 106 such that the mandrel 106 is optionally either rotatable or non-rotatable. The mandrel support assembly 108 can support both ends of the mandrel 106 such that the mandrel 106 is optionally either rotatable or non-rotatable, but then the mandrel support assembly 108 needs to be removable from one end to allow a sleeve 104 to be mounted on and removed from the mandrel 106. The mandrel support assembly 108 can also support the mandrel 106 such that the mandrel 106 is or is not adapted to move along its longitudinal axis 118. If the mandrel 106 is linearly movable along its axis 118, the mandrel 106 can be moved along with the sleeve 104 when the element 102 is formed in a helical fashion. This embodiment is not depicted. If the mandrel 106 is not linearly movable along its axis 118, the sleeve 104 moves axially along the mandrel 106, itself, when the element 102 is formed in a helical fashion. The mandrel support assembly 108 can be any structure that performs these functions. In one embodiment, the mandrel support assembly 108 can comprise a pair of pillow blocks 136 with bearings 138 rotatably supporting the first end 120 of the mandrel 106. In the event different mandrels having different outer diameters are used, corresponding sized support assemblies would be needed or a support assembly that can be adjusted to hold different sized mandrels. The mandrel support assembly 108 can include a locking device 140 which prohibits the mandrel 106 from rotating in a locked mode and allows the mandrel to rotate in an unlocked mode. The locking device 140 can include a clamp 142 and/or a pin 144 that inserts in a corresponding hole or slot (not depicted) in the mandrel 106 thereby preventing rotation of the mandrel 106.

Calendering Assembly

The calendering assembly 110 comprises at least one calender roll assembly 154, a first support assembly 156, and a second support assembly 158.

Preferably, there are a plurality of the calender roll assemblies 154. Each calender roll assembly 154 has a longitudinal axis 172, a calender roll 174, a first journal 176, and a second journal 178, the first and second journals 176,178 supporting first and second ends of the calender roll 174, respectively. The length and outer diameters of the calendar rolls 174 are not critical. Preferably, each of the calender rolls 174 has the same length in a range of about 35 cm to about 66 cm and the same outer diameter in a range of about 7.5 cm to about 15.5 cm. A thin non stick layer can be applied to an outer circumferential surface of the calender rolls 174 to prevent the photopolymer material from sticking to the calender rolls 174. The non stick layer can be made of Teflon®, Silverstone® or an acceptable substitute. Preferably, the longitudinal axis 172 of each calender roll assembly 154 is parallel to the longitudinal axes 172 of the other calender roll assemblies 154. Preferably, in the first operating mode and the second operating mode, first ends and second ends of the calender rolls 174 are substantially equally spaced a metering gap distance of about 0.254 mm (10 mils) to 7.62 mm (300 mils) from the sleeve 104. The metering gap is the thickness of one photosensitive layer on the sleeve 104.

In the first operating mode, the calender rolls 174 comprise metering means for metering a stream 113 of molten photopolymerizable material on the sleeve 104 to have a substantially constant thickness. In the second mode, the calender rolls 174 comprise wrapping means for wrapping a molten or solid sheet 115 of photopolymerizable material around the sleeve 104 and metering means for metering the solid or molten sheet 115 of photopolymerizable material to have a substantially constant thickness on the sleeve 104 and filling any gap 162 between a leading end 164 of the sheet 115 and a trailing end 166 of the sheet 115. In the second mode, the calendering assembly 110 wraps the molten or solid sheet 115 onto the sleeve 104 such that (i) there is a slight gap 162 between a leading end 164 and a trailing end 166 of the sheet (see FIG. 2A) or (ii) a portion 168 of a trailing end of the sheet 115 slightly overlaps a leading end 170 of the sheet 115 (see FIG. 2B). The calendering assembly 110 meters the photopolymerizable material so as to fill slight gaps 162 and flatten overlapped portions 168 to make the material have a substantially constant thickness with a seamless uniform outer circumferential surface.

The first support assembly 156 comprises a first plate 180 defining a passage 182 through which the mandrel 106 extends. Similarly, the second support assembly 158 comprises a second plate 184 defining a passage 186 through which the mandrel 106 extends.

The first plate passage 182 and the second plate passage 186 are large enough so that while the cylindrical photosensitive element 102 is being formed, the drive system 112 can move the sleeve 104 through the first plate passage 182 and move the cylindrical photosensitive element 102 along the longitudinal axis 118 of the mandrel 106 through the second plate passage 186 resulting in the cylindrical photosensitive element 102 having an axial length greater than the length of the calender rolls 174 or the distance between the first plate 180 and the second plate 184. Therefore, the structures defining the first plate passage 182 and the second plate passage 186 comprise forming means for forming the element 102 to have an axial length greater than a distance between the first plate 180 and the second plate 184 or, stated another way, greater than an axial length of the mandrel 106 in the calendering assembly 110.

Figure 2A:
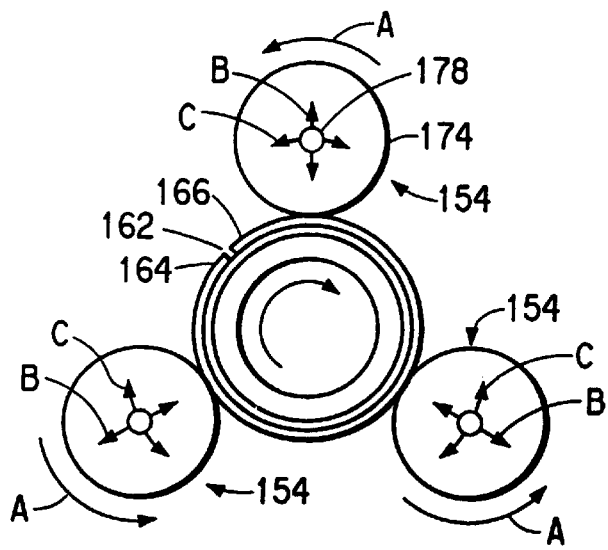
FIGS. 2A and 2B are schematic cross sectional views through a calendering assembly of the forming apparatus of FIG. 1 immediately after a sheet of photosensitive material is wrapped around a mandrel in a shape of a cylinder having a gap and an overlapping portion, respectively.

The first and second support assemblies 156,158 comprise first support means for rotatably supporting the journals 176,178 of the calender roll assemblies. The first support means which enable the rotational movement of the calender roll assemblies 154 is schematically illustrated in FIGS. 1 and 2A by arrows A. The first and second support assemblies 156,158 comprise second support means for radially moving the journals 176,178 of the calender roll assemblies 154. The second support means which enables the radial movement of the calender roll assemblies 154 is illustrated in FIGS. 1 and 2A by arrows B. Metering gaps between the sleeve 104 and the rolls 174 can be selected by adjusting the second support means B prior to operation. Either one or both of the first and second support assemblies 156,158 further comprise third support means for moving the journals 176,178 of the calender roll assemblies 154 circumferentially about the mandrel 106. The third support means are illustrated in FIGS. 1 and 2A by arrows C. The third support means C can be adjusted prior to operation such that the longitudinal axes 172 of the calender roll assemblies 154 are skewed with repect to, or parallel to, the longitudinal axis 118 of the mandrel 106.

Drive System

Figure 5:
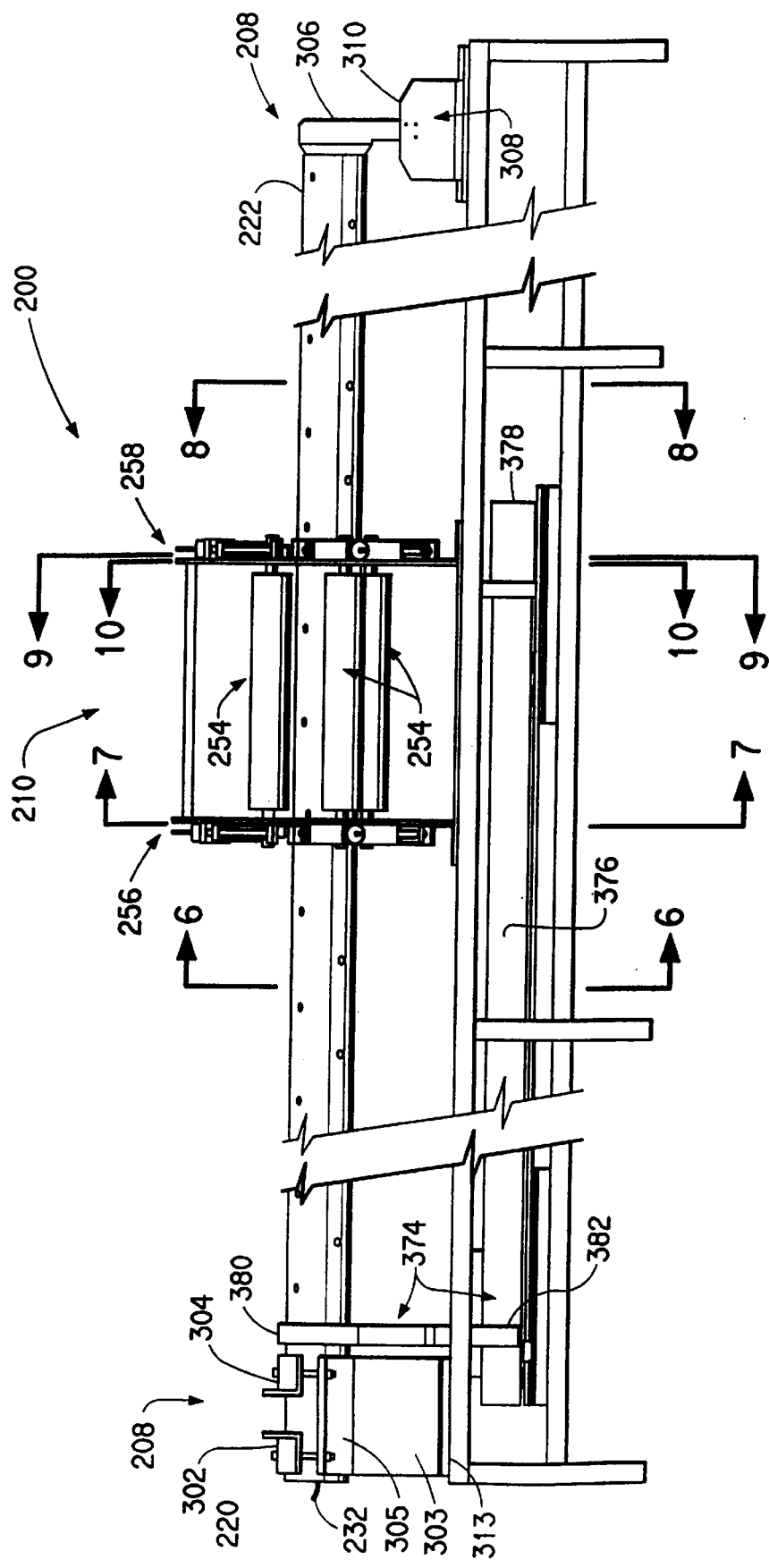
FIG. 5 is a front view of the forming apparatus of FIG. 4 showing a calendering section with a plurality of calendar roll assemblies having parallel longitudinal axes.

The drive system 112 comprises moving means for moving the sleeve 104 around and along the longitudinal axis 118 of the mandrel 106 towards a right end of the apparatus 100 as depicted in FIG. 5 in a helical fashion to polish an outer circumferential surface of the element 102 to a seamless uniform state without sanding, grinding or additional polishing apparatus. The moving means 112 comprises rotating means for rotating the calender roll assemblies 154 and axial moving means for moving the sleeve 104 axially along towards the right end of the apparatus 100 as depicted in FIG. 5.

The rotating means comprises a roll drive system 160. The roll drive system 160 can comprise a separate motor assembly 188 adapted to rotate each calender roller assembly 154, or one motor assembly adapted to rotate all the calender roll assemblies 154, through sprockets and chains, or belts and pulleys. The roll drive system 160 is preferably capable of rotating the calender roll assemblies 154 up to about 60 rpm, and would typically rotate the calender roll assemblies 154 in a range of about 15 rpm to about 90 rpm. When the photopolymerizable material is between the calender rolls 174 and the sleeve 104 supported on the mandrel 106, the photopolymerizable material translates the motion of the calender roll assemblies 154 to the sleevth 104 thereby rotating the sleeve 104. If the mandrel 106 is rotatably supported, then the mandrel 106 rotates with the sleeve 104.

Optionally, one can manually, or one can provide some structure to, rotate the sleeve 104 until sufficient photopolymerizable material is in contact with the calendar rolls 174 and the sleeve 104, to translate the motion of the calendar rolls 174 to rotate the sleeve 104. Such structure can be considered part of the moving means 112. One structure that can assist in initially rotating the sleeve 106 is a rubber band or polymeric strip 105 that is positioned around the leading end of the sleeve 104 to immediately fill the metering gap between the sleeve 104 and the calender rolls 174 as soon as the leading end of the sleeve 104 is fed into the calendering section 110 from left to right in FIG. 1.

Optionally, the moving means 112 can have a mandrel drive mechanism 146 for rotating or assisting to rotate the mandrel 106 when the locking device 140 is in the unlocked mode. The mandrel drive mechanism 146 can comprise a motor assembly 148 connected to rotate a drive pulley 150. A belt 152 can extend around the drive pulley 150 and the mandrel 106 so that when the motor assembly 148 is activated, the mandrel 106 is rotated. Sprockets and a chain can be used instead of the pulley 150 and belt 152. The mandrel drive mechanism 146 is preferably capable of rotating the mandrel 106 such that the surface speed (tangential velocity of the surface) of the photosensitive material on the sleeve 104 on the mandrel 106 is the same as the surface speed (tangential velocity of the surface) of the calender rolls 174.

The axial moving means can comprise the roll drive system 160 when the axes 172 of the calender roll assemblies 154 are skewed with respect to the longitudinal axis 118 of the mandrel 106. When the axes 172 of the calender roll assemblies 154 are skewed with respect to the longitudinal axis 118 of the mandrel 106, the photopolymer material translates the motion of the calender rolls 174 so as to apply an axial component D of force on the sleeve 104 thereby moving the sleeve 104 along the longitudinal axis 118 of the mandrel 106 towards the right end of the apparatus 100 as depicted in FIG. 5. Sufficent axial movement of the sleeve 104 can be provided when the axes 172 of the calender roll assemblies 154 are skewed at an angle of about 1 degree to about 2 degrees with respect to the longitudinal axis 118 of the mandrel 106.

Alternatively or in addition, the axial moving means can comprise a linear transport system, such as a linear actuator, that pushes or pulls the sleeve 104, or the sleeve 104 and the mandrel 106, along the longitudinal axis 118 of the mandrel 106. The linear transport system can be adapted to push or pull the sleeve 104 into an initial position where the photosensitive material is first fed onto the sleeve 104. Then the linear transport system can be deactivated to allow the roll drive system 160 to provide further axial movement of the sleeve and applied photosensitive material. Alternatively, when the photosensitive material is fed onto the sleeve 104, the axes 172 of the calender roll assemblies 154 can be parallel to the longitudinal axis 118 of the mandrel 106. In this case, the linear transport system would continue to provide the axial movement of the sleeve and applied photosensitive material during the formation of the element 102. Alternatively, both the linear transport system and the roll drive system 160 can provide axial force in moving the sleeve and applied photosensitive material during the formation of the element 102.

Heating Element

The heating element 114 is for heating the photopolyinerizable material while the photopolymerizable element 102 is being formed. Preferably, there is a heating element 114 in each of the calender roll assemblies 154. Instead or in addition, one or more heating element 114 can be outside the calender roll assemblies 154. When molten photopolymerizable material is supplied to the apparatus 100, the heating elements 114 heat, or maintain, the outer surface of the calender rolls 174 at a temperature in a range of 90° C. to 180° C. thereby heating the photopolymerizable material while it is in contact with the calender roll assemblies 154. When a solid sheet of photopolymerizable material is supplied to the apparatus 100, the heating elements 114 heat, or maintain, the outer surface of the calender rolls 174 at a temperature in a range of 90° C. to 180° C. When a solid sheet 115 is fed into the apparatus 100, the heating elements 114 heat the sheet beyond its glass transition temperature to permit metering. When a molten stream 113 or sheet 115 is fed into the apparatus 100, the heating elements 114 heat the outer surface of the calender rolls 174 so as to maintain the photosensitive material in a molten or semi fluid state to permit metering. The heating elements 114 can be supported to be rotatable with, or non-rotatable with respect to, the calender roll assemblies 154. Electrical connections to the heating elements 114 can extend through one or both ends of the calender roll assemblies 154.

Method of Operation

In operation, certain adjustment are made, if necessary, prior to forming the element 102. For instance, for both the first and the second modes of operation, the second support means B are adjusted, if necessary, to set the radial distance of the calender rolls 174 from the outer cylindrical surface of the sleeve 104 to the desired metering gap. For both the first and the second modes of operation, the third support means C are adjusted, if necessary, to make the longitudinal axes 172 of the calender roll assemblies 154 skewed with respect to, or parallel to, the longitudinal axis 118 of the mandrel 106. For both the first and the second modes of operation, the locking device 140, if present, is set in the locked mode prohibiting rotation of the mandrel 106 or in the unlocked mode permitting rotation of the mandrel 106. For both the first and the second modes of operation, the mandrel drive system 146 can be activated to rotate or assist in rotating the mandrel 106 and thereby the sleeve 104, or not activated.

Then an operator slides a flexible sleeve 104 on the second end 122 of the mandrel 106 and slides the sleeve 104 along the mandrel 106 to an initial position ready for receiving the stream 113 or sheet 115 of photopolymerizable material. Alternatively, the linear transport system of the drive system 112 can move the sleeve 104 along the mandrel 106 to its initial position. In the first mode, the sleeve's initial position is substantially between the mandrel support assembly 108 supporting the first end 120 of the mandrel 106 and the calendering assembly 110 with the leading edge of the sleeve 104 positioned under the extruder line 116 in the calendering assembly 110. In the second mode, the sleeve can either move axially or not move axially along the longitudinal axis 118 of the mandrel 106. When the sleeve 104 is adapted to move axially along the mandrel 106 so as to form the element 102 in a helical fashion from a solid or molten strip (or sheet) of material, the initial position of the sleeve is also substantially between the mandrel support assembly 108 supporting the first end 120 of the mandrel 106 and the calendering assembly 110 with the leading edge of the sleeve 104 positioned to receive the entire leading edge of the solid or molten strip. When the sleeve 104 does not move axially along the mandrel 106, then any portion of the sleeve 104 can be positioned to receive the leading end of the sheet 115. When the sleeve 104 is being positioned on the mandrel 106, the pneumatic system 126 can be suppling air to facilitate movement of the sleeve 104 axially along and rotationally about the mandrel 106.

Then in the first mode, the stream 113 of molten photopolymerizable material is supplied from the extruder line 116 to between one of the calender rolls 174 and the sleeve 104 supported by the mandrel 106. Preferably, in the first mode, the photopolymerizable material is supplied in a generally cylindrical shaped stream having an average diameter of about 1 cm at a rate of about 4.5 kg/hr to about 55 kg/hr. In the second mode, the solid or molten sheet 115 is supplied to between one of the calender rolls 174 and the sleeve 104 supported by the mandrel 106. Preferably, in the second mode, the sheet 115 is supplied having a thickness of about 0.254 mm (10 mils) to about 7.62 mm (300 mils). Depending on the material used, the molten stream 113 or molten sheet 115 of photopolymerizable material is typically supplied at a temperature in a range of about 90° C. to about 180° C. The solid sheet 115 is supplied at room temperature.

Figure 2B:
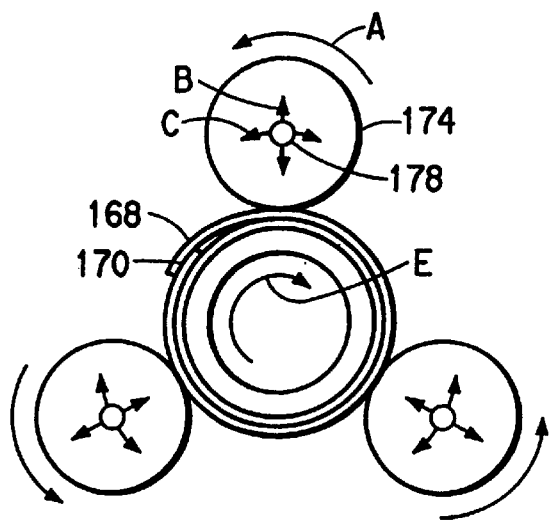

The calender roll assemblies 154 are rotated by the roll drive system 160. The photopolymerizable material between the calender rolls 174 and the sleeve 104 translates the motion of the calender roll assemblies 154 to the sleeve 104 thereby moving the sleeve 104 and the photopolymerizable material circumferentially about the longitudinal axis 118 of the mandrel 106 (in the direction of arrow E in FIG. 1). The roll drive system 160 rotates the calender roll assemblies 154 to meter the photopolymerizable material to have a substantially constant thickness on the sleeve 104. Repeated contact between the outer circumferential surface of the element 102 and the rolls 174 each revolution of the sleeve 104 during formation of the element 102 polishes the outer circumferential surface of the element 102 without sanding, grinding or additional polishing apparatus. In the second mode, the photopolymerizable material sheet 115 between the calender roll 174 and the sleeve 104 translates the motion of the calender roll assembly 154 to the sleeve 104 thereby additionally wrapping the photopolymerizable material circumferentially about the sleeve 104 as illustrated in FIGS. 2A or 2B. In the second mode, the calender roll assemblies 154 also meter the photopolymerizable material to fill any gap 162 between edges of the sheet 115.

If the longitudingal axes 172 of the calender rolls 174 are skewed with respect to the longitudinal axis 118 of the mandrel 106, then the photopolymerizable material between the calender rolls 174 and the sleeve 104 also moves the sleeve 104 axially along the longitudinal axis 118 of the mandrel 106 (in the direction of arrow D in FIG. 1) forming the seamless cylindrical photosensitive element 102 in a helical fashion. Alternatively, or in addition, to the longitudingal axes 172 of the calender rolls 154 being skewed with respect to the longitudinal axis 118 of the mandrel 106, while the roll drive system 160 rotates the calender roll assemblies 154, the linear transport system of the drive system 112 can move the sleeve 104 along the longitudinal axis 118 of the mandrel 106 thereby forming the seamless cylindrical photosensitive element 102 in a helical fashion.

During the element formation process, the heating elements 114 heat, or maintain, the photopolymerizable material at a sufficient temperature to cause the material to be, or remain, in a substantially molten state for at least several revolutions around the mandrel 106 until adjacent edges or windings of the material are fused seamlessly together.

In the second mode, when the calendering assembly does not move the element 102 axially along the mandrel 106, after formation of the element 102, the second support means B are adjusted to move the the calender rolls 174 away from the outer cylindrical surface of the element 102. Then the element 102 and sleeve 104 can be slid axially off the mandrel 106 either manually or by the axial tranport system.

Figure 3:
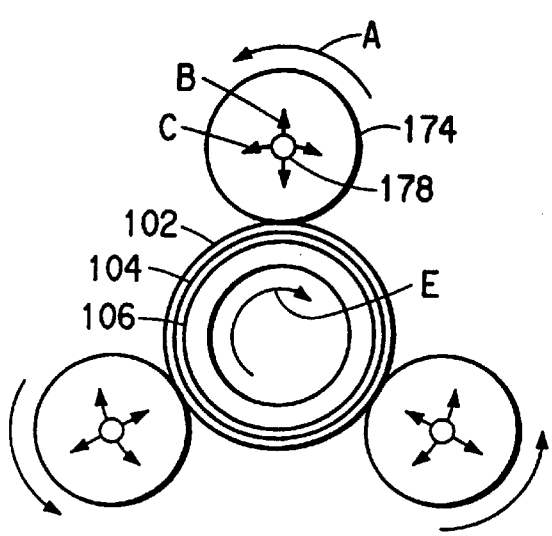
FIG. 3 is a schematic cross sectional view of the calendering assembly showing a seamless cylindrical photosensitive element formed after multiple revolutions of the stream of molten photopolymer or the photosensitive sheet around the mandrel.
Figure 4:
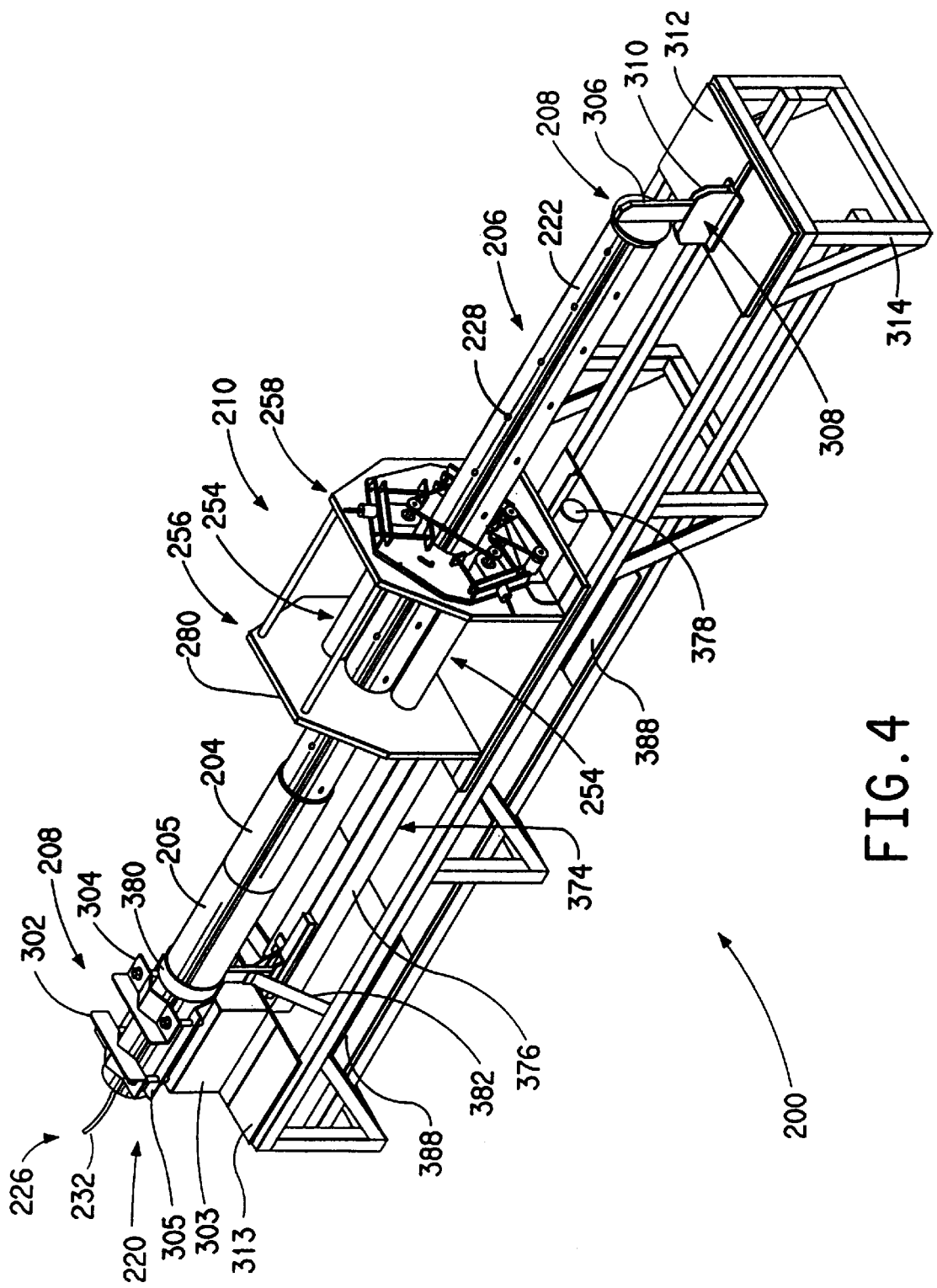
FIG. 4 is an isometric view of a preferred embodiment of a cylindrical photosensitive element forming apparatus in accordance with the invention.

FIG. 3 is a schematic cross sectional view of the calendering assembly 110 showing a seamless cylindrical photosensitive element 102 formed after multiple revolutions of the stream 113 of molten photopolymerizable material or the photosensitive sheet 115 around the mandrel 106.

After the photopolymerizable element 102 has cooled, the apparatus 100 can be used to apply additional seamless photopolymerizable layers, one at a time, on the first seamless photopolymerizable element or layer 102. In such cases the metering gap is the distance between the calender rolls 174 and the outer layer already on the sleeve 104.

Seamless cylindrical photosensitive elements having one photopolymerizable layer 102 can be formed in less than an hour using the apparatus 100. For instance, a seamless cylindrical photosensitive element 102 having a length of about 45.73 cm and a thickness of about 67 mils can be formed on a flexible sleeve having an outer diameter of about 9 cm in about 3 minutes on the apparatus 100 operated in the first mode when a stream of of molten photopolymerizable material is fed having a diameter of about 0.95 cm at a rate of about 4.5 kg/hr, the calender rolls 174 have an outer diameter of about 7.518 cm and are rotated at about 27 rpm, the axes 172 of the calender rolls are skewed at an angle of 1.5 degrees with respect to the longitudinal axis 118 of the mandrel 106, and the heating element 114 maintains the outer surface of the calender rolls at about 121° C. A seamless cylindrical photosensitive element 102 having a length of about 22.86 cm and a thickness of about 67 mils can be formed on a flexible sleeve having an outer diameter of about 9 cm in about 10 minutes on the apparatus 100 operated in the second mode when the sleeve 104 does not move axially along the mandrel longitudinal axis 118 when a solid, room temperature, sheet of photopolymerizable material is introduced having a thickness of about 134 mils, a length of about 25.4 cm and a width of about 15.24 cm, the calender rolls 174 have an outer diameter of about 7.518 cm and are rotated at about 32.4 rpm, and the heating element 114 heats the outer surface of the calender rolls at about 121° C.

PREFERRED EMBODIMENT

FIGS. 4–13 illustrate a preferred embodiment of a cylindrical photosensitive element forming apparatus 200 in accordance with the invention. Designating numbers of elements or features in the preferred embodiment of FIGS. 4—13 that correspond to like elements or features in the embodiment of FIGS. 1–3 are increased by 100.

Figure 11:
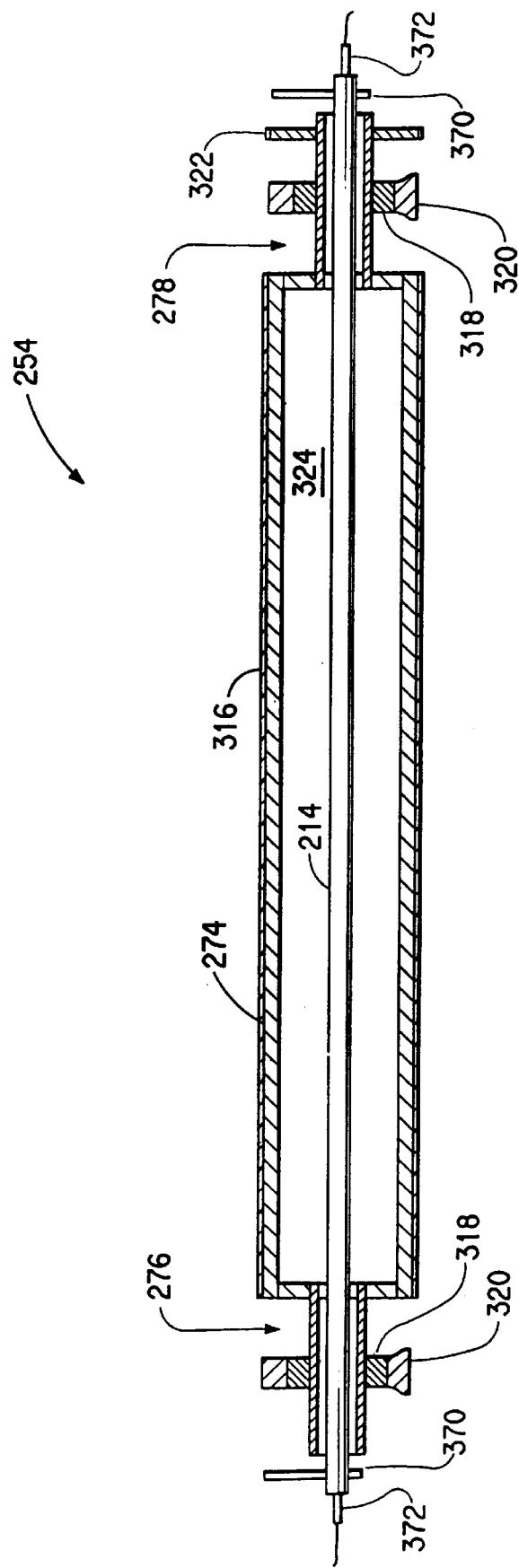
FIG. 11 is a cross sectional view of one of the calendar roll assemblies along its longitudinal axis.

The forming apparatus 200 comprises a mandrel 206, a mandrel support assembly 208, a calendering assembly 210, a drive system 212 and a heating element 214. The heating element 214 is best seen in FIG. 11.

Mandrel

The mandrel 206 is a cylindrical shaft having a longitudinal axis, a first end 220 and a second end 222. In this embodiment, the mandrel 206 does not rotate in the first and the second modes. Instead, the sleeve 204 is rotatable about the mandrel 206. The mandrel 206 defines an internal cavity 224. See FIG. 6.

Pneumatic System

A pneumatic system 226 is provided for supplying air through an air supply line 232, to the internal cavity 224, through passages 228 in the mandrel 206 to an outer circumferential surface of the mandrel to facilitate movement of the sleeve 204 axially along and rotationally about the mandrel 206. The pneumatic system 226 is like the one disclosed in U.S. Pat. No. 5,301,610.

Mandrel Support Assembly

The mandrel support assembly 208 supports the first end 220 of the mandrel 206 with a fixed support assembly 302,303,304,305,313 which prevents rotation of the mandrel 206. The mandrel support assembly 208 further comprises a moveable or retractable support 306 for holding the second end 222 of the mandrel 206. The moveable support 306 pivots about a pin 308 held in a support base 310 which in turn is secured to a plate 312 fixed to a frame 314. The moveable support 306 pivots away from the second end 222 of the mandrel 206 to allow sleeves 204 with or without photosensitive elements 202 formed thereon to be slid on or off the mandrel 206.

Calendering Assembly

The calendering assembly 210 comprises three calender roll assemblies 254, a first support assembly 256, and a second support assembly 258.

FIG. 11 is a cross sectional view of one of the calender roll assemblies 254. Each of the calender roll assemblies 254 comprises a longitudinal axis, a calender roll 274, a first journal or end 276, and a second journal or end 278, the first and second journals 276, 278 supporting ends of the calender roll 274. Each of the calender rolls 274 has a length of 63 cm and an outer diameter of 10 cm. A thin non stick layer 316 is applied to an outer circumferential surface of the calender rolls 274 to prevent the photopolymer material from sticking to the calender roll 274. The layer 316 is made of Silverstone®. The journals 276,278 are rotatably supported in bearings 318 of pillow blocks 320. A passage or cavity 324 extends through the journals 276,278 and the calender roll 274.

Figure 7:
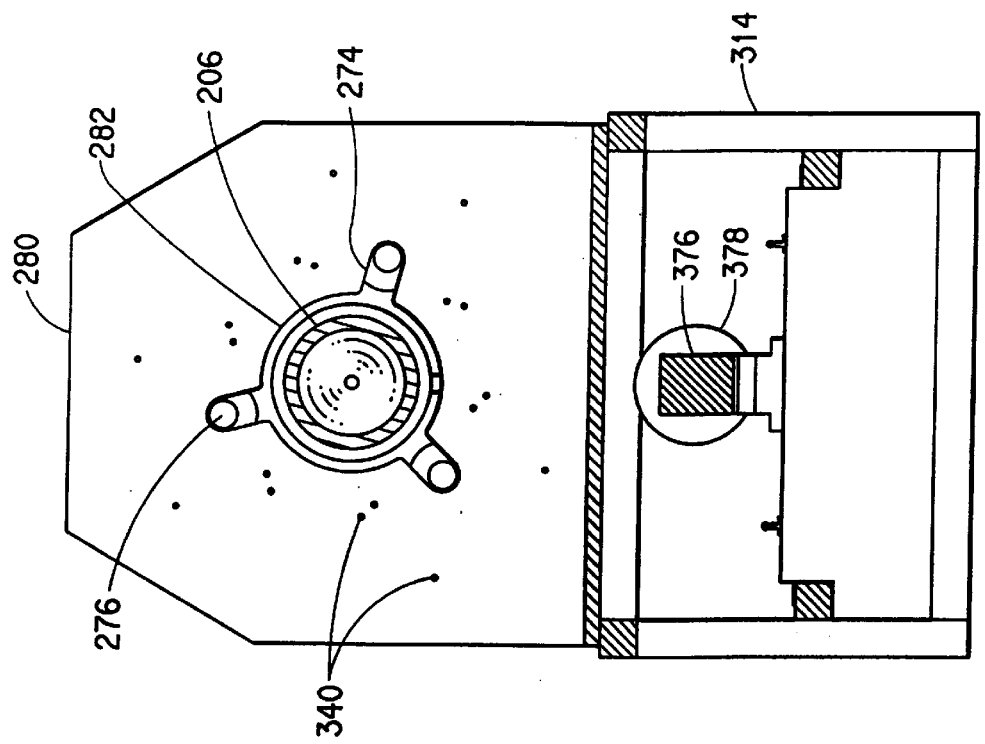
FIG. 7 is a cross sectional view generally along line 7—7 in FIG. 5 in the direction of the arrows showing the view depicted in FIG. 6 except with the radially positionable support devices removed.
Figure 6:
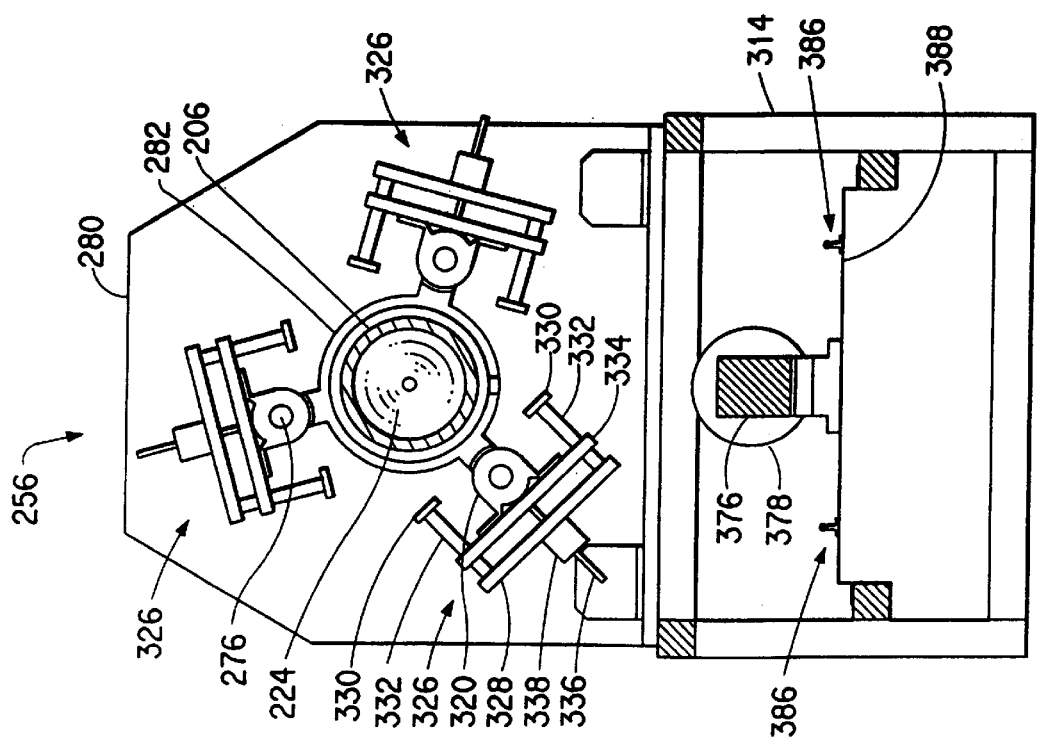
FIG. 6 is a cross sectional view generally along line 6—6 in FIG. 5 in the direction of the arrows showing an insertion end of a calendar section with first calender roll end portions rotatably supported in radially positionable support devices.

The first support assembly 256 comprises a first plate 280 and radially positionable support devices 326 mounted on the first plate 280. FIG. 6 is a cross sectional view generally along line 6—6 in FIG. 5 in the direction of the arrows showing an input side of the first plate 280 with first journals or calender roll end portions 276 rotatably supported in the radially positionable support devices 326. FIG. 7 is a cross sectional view generally along line 7—7 in FIG. 5 in the direction of the arrows showing the view depicted in FIG. 6 except with the radially positionable support devices 326 removed. The first plate 280 has a passage 282 through which the mandrel 206 extends. The passage 282 is shaped to also allow the first journals 276 of the calender roll assemblies 254 to extend through the passage 282 so that the radially positionable support devices 326 can be mounted on an input side of the first plate 280, rather than between the first plate 280 and the calender roll assemblies 254.

Each of the radially positionable support devices 326 comprises a support block 328, first and second shaft supports 330, first and second shafts 332, a pillow block 320, a traveling pillow block support 334, a threaded shaft 336, and a stepper motor 338. The support block 328 and first and second shaft supports 330 are fixed to the first plate 280, such as, by screws or bolts through passages 340 in the first plate 280. The first and second shafts 332 are connected between the support block 328 and the first and second shaft supports 330, respectively. The pillow block 320 includes a bearing which rotatably supports the first journal 276 of one of the calender roll assemblies 254. The pillow block 320 is mounted on the traveling pillow block support 334 which has bores for sliding along the first and second shafts 332. The stepper motor 338 is mounted on the support block 328 and turns the threaded shaft 336 which is connected to the traveling pillow block support 334 to cause it and the first journal 276 to be moved radially with respect to the mandrel 206.

The second support assembly 258 comprises a second plate 284, an angularly positionable subplate 342 and second radially positionable support devices 344. The second support assembly 258 is illustrated in detail in FIGS. 8A, 8B, 9 and 10.

Figure 8A:
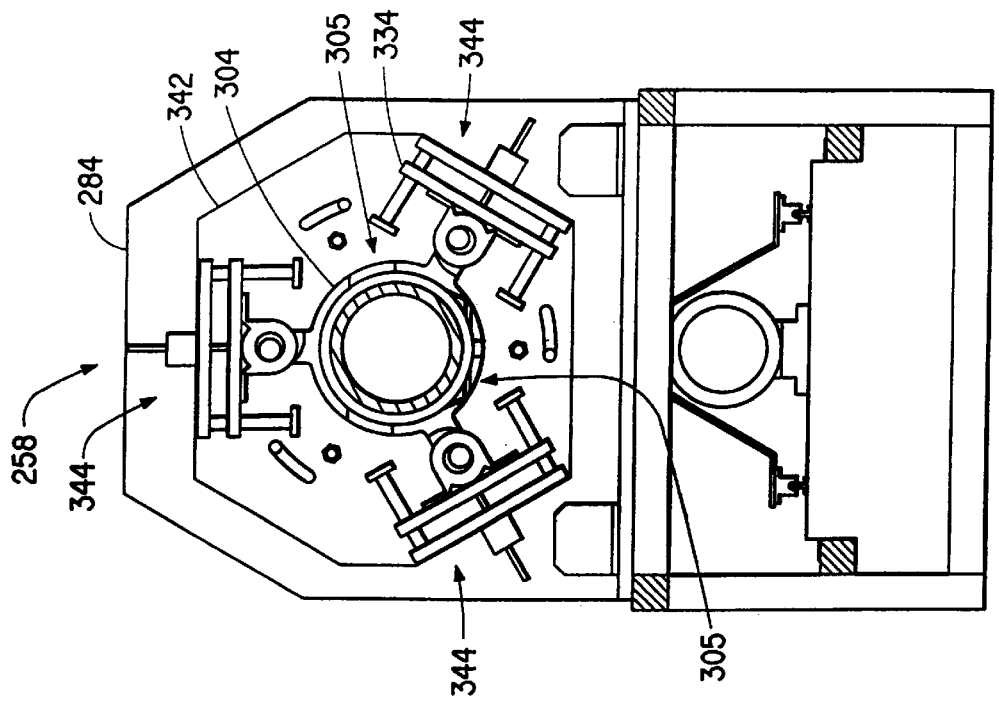
FIG. 8A is a cross sectional view generally along line 8—8 in FIG. 5 in the direction of the arrows showing an exit end of the calendar section with an angularly positionable subplate in a first angular orientation with respect to a mandrel and second calender roll end portions rotatably supported by radially positionable support devices in a first radial position with respect to the mandrel.
Figure 9:
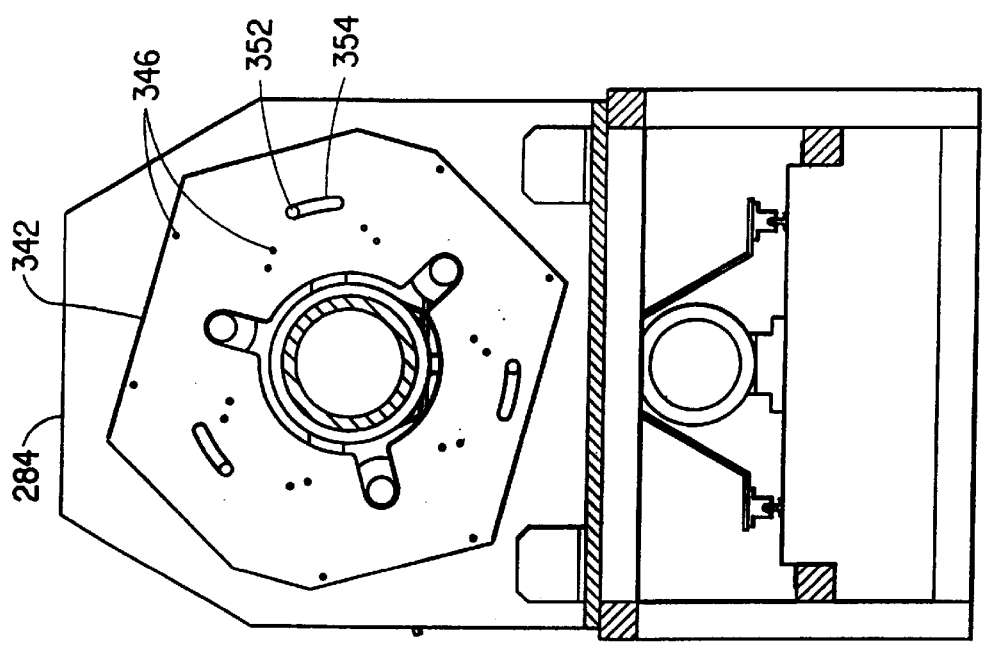
FIG. 9 is a cross sectional view generally along line 9—9 in FIG. 5 in the direction of the arrows showing the view depicted in FIG. 8A except with the radially positionable support devices removed.

The second radially positionable support devices 344 are the same as the first radially positionable support devices 326. However, the second radially positionable support devices 344 are mounted to the subplate 342, such as, by screws or bolts, through passages 346 in the subplate 342. This is best seen in FIGS. 8A and 9.

Figure 8B:
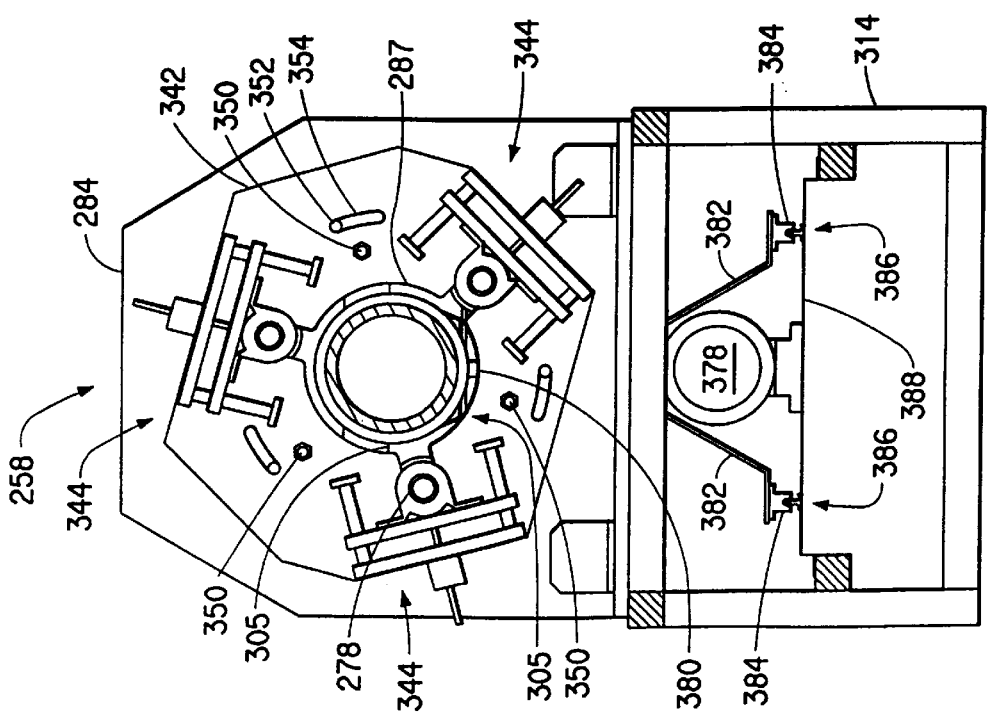
FIG. 8B is the same as FIG. 8A except the angularly positionable subplate is in a second angular orientation with respect to the mandrel.
Figure 10:
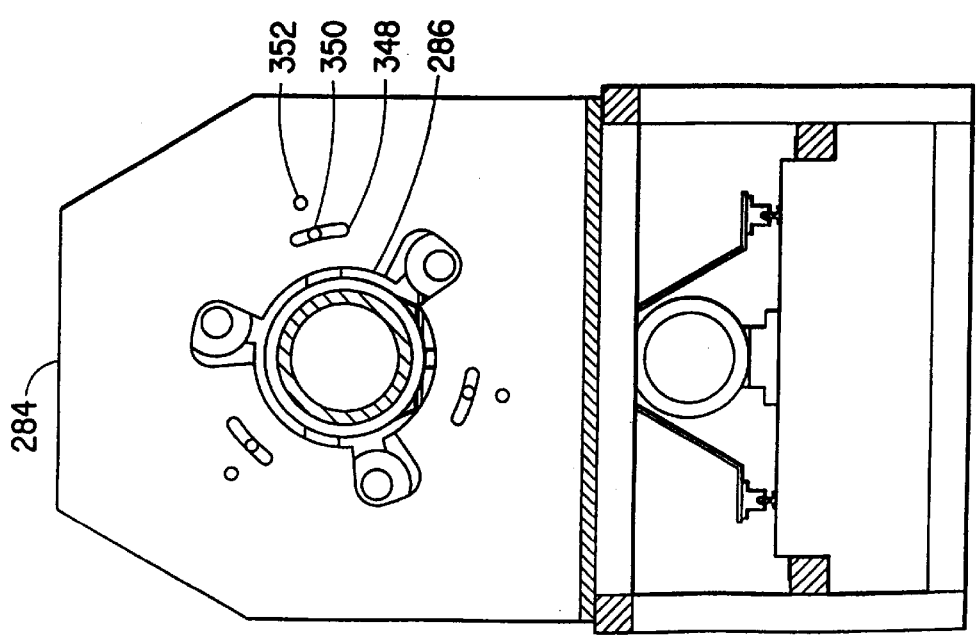
FIG. 10 is a cross sectional view generally along line 10—10 in FIG. 5 in the direction of the arrows showing the view depicted in FIG. 8A except with the radially positionable support devices and the angularly positionable subplate removed.

Referring to FIG. 10, the second plate 284 has angular slots 348 for receiving bolts 350 for mounting the subplate 342 on, and at various angular orientations with respect to, the second plate 284. FIG. 8A is a cross sectional view generally along line 8—8 in FIG. 5 in the direction of the arrows showing an exit side of the calendering assembly 210 with the angularly positionable subplate 342 mounted in a first angular orientation with respect to the second plate 284 (and therefore the mandrel 206). FIG. 8B is the same as FIG. 8A except the angularly positionable subplate 342 is mounted on the second plate 284 in a second angular orientation with respect to the mandrel 206. Thus, in the second angular orientation, the subplate 342 is rotated with respect to the second plate 284 such that the subplate 342 is circumferentially spaced about the mandrel 206 with respect to the first angular orientation. When the subplate 342 is in the second orientation, the longitudinal axes of the calender roll assemblies 254 are skewed with respect to the longitudinal axis of the mandrel 206. When the subplate 342 is in the first orientation, the longitudinal axes of the calender roll assemblies 254 are parallel to the longitudinal axis of the mandrel 206.

The subplate 342 is positioned on the second plate 284 with the help of locating pins 352 which are mounted on the second plate 284 and insert in angular alignment slots 354 in the subplate 342.

The second plate 284 and the subplate 342 have aligned passages 286, 287 through which the mandrel 206 extends. The second plate passage 286 and the subplate passage 287 are large enough so that while the cylindrical photosensitive element is being formed, the roll drive system 260 and/or the linear transport system 374 can move the cylindrical photosensitive element along the mandrel 206 through the second plate passage 286 and then the subplate passage 287 resulting in the cylindrical photosensitive element having a length greater than a distance between the first plate 280 and the second plate 284.

Drive System

Figure 12:
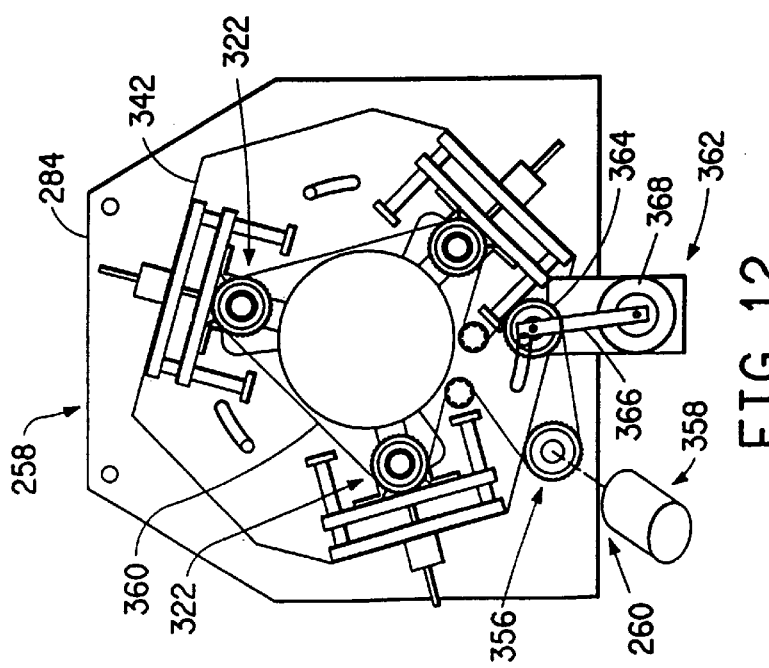
FIG. 12 is the same as part of FIG. 8A except it additionally shows a drive system for rotating the calender roll assemblies.

The drive system comprises a roll drive system 260. Referring to FIG. 12, the roll drive system 260 comprises a roll sprocket 322 on the second journal 278 of each of the calender roll assemblies 254, a drive sprocket 356, a motor assembly 358 connected to rotate the drive sprocket 356, and a drive chain 360 around the roll sprockets 322 and the drive sprocket 356. A tensioning device 362 is provided comprising an idler sprocket 364 mounted on a pivoting bracket 366 which is biased (clockwise in FIG. 12) by a cylindrially wound spring device 368 to provide a predetermined tension in the drive chain 360.

Referring back to FIGS. 4 and 5, the drive system 212 further comprises a linear transport system 374 for moving the sleeve 204 along the longitudinal axis of the mandrel 206. The linear transport system 374 comprises a linear actuator 376 which has a screw shaft connected to a drive motor 378. A push/pull arm 380 is mounted to the screw shaft and extends around the mandrel 206 to push or pull sleeves 204 or sleeve pushers 205 along the mandrel 206. Support brackets 382 extend from the push/pull arm 380. Referring to FIG. 8A, bearings 384 connected to ends of the support brackets 382 ride along support rails 386. The linear actuator 376, the drive motor 378 and the support rails 386 are mounted on support plates 388 which in turn are mounted on the frame 314.

Figure 13:
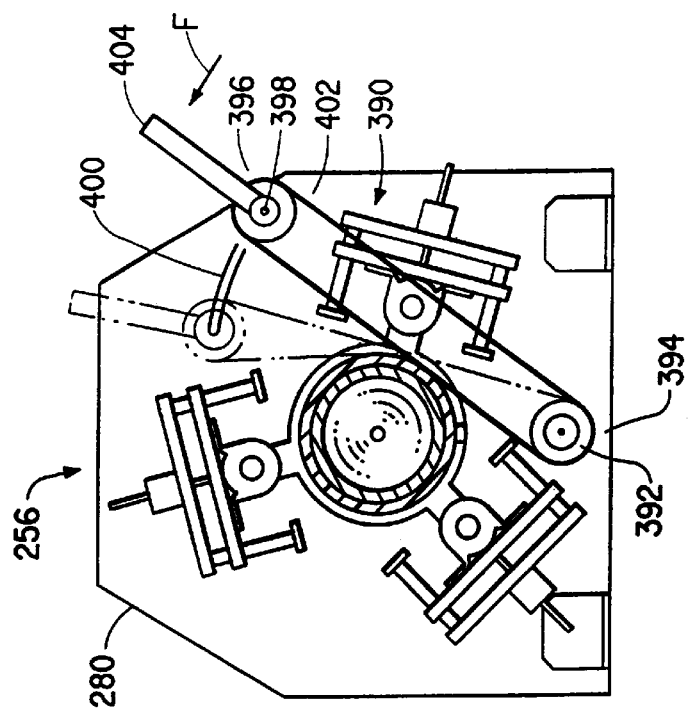
FIG. 13 is the same as part of FIG. 6 except it shows a drive system for rotating the sleeve about the mandrel.

Referring to FIG. 13, the drive system 212 further comprises a sleeve drive system 390 mounted on the input side of the first plate 280 for rotating the sleeve 204 about the mandrel 206 when the transport system 374 moves the sleeve 204 to the calendering assembly 210. The sleeve drive system 390 comprises a motor assembly 392 connected to rotate a drive pulley 394, an idler pulley 396 slideably mounted such as with a bolt 398 through an angular slot 400 in the first plate 280, and a belt 402 around the drive pulley 394 and the idler pulley 396. A handle 404 is connected to the idler pulley 396 so that when the handle 404 is pushed in the direction of arrow F in FIG. 13 to the position depicted by phantom lines, the belt 402 contacts a sleeve 204 while it is being fed into the calendering assembly 210 thereby causing the sleeve 204 to intially rotate. When the handle 404 is released, the idler pulley 396 slides back down the slot 400 returning to its home or inactive position.

Heating Element(s)

Referring back to FIG. 11, heating elements 214 extend through the passages or cavities 324. Ends of the heating elements 214 are non rotatably supported by brackets 370 which can be mounted on traveling pillow block supports 334 of the radially positionable support devices 344. Electrical connections 372 extend from both ends of the heating elements 214.

PHOTOPOLYMERIZABLE MATERIAL

As used herein, the term "photopolymerizable" is intended to encompass systems which are photopolymerizable, photocrosslinkable, or both. The photopolymerizable layer comprises an elastomeric binder, at least one monomer and an initiator, where the initiator has a sensitivity to actinic radiation. In most cases, the initiator will be sensitive to visible or ultraviolet radiation. Any photopolymerizable compositions which are suitable for the formation of flexographic printing plates can be used for the present invention. Examples of suitable compositions have been disclosed, for example, in Chen et al., U.S. Pat. No. 4,323,637, Gruietzmacher et al., U.S. Pat. No. 4,427,749 and Feinberg et al., U.S. Pat. No. 4,894,315.

The elastomeric binder can be a single polymer or mixture of polymers which can be soluble, swellable or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Worns U.S. Pat. No. 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231 can be used. It is preferred that the binder be present in at least an amount of 65% by weight of the photosensitive layer.

The term binder, as used herein, encompasses core shell microgels and blends of microgels and preformed macromolecular polymers, such as those disclosed in Fryd et al., U.S. Pat. No. 4,956,252.

The photopolymerizable layer can contain a single monomer or mixture of monomers which must be compatible with the binder to the extent that a clear, non-cloudy photosensitive layer is produced. Monomers that can be used in the photopolymerizable layer are well known in the art and include but are not limited to addition-polymerization ethylenically unsaturated compounds having relatively low molecular weights (generally less than about 30,000). Preferably, the monomers have a relatively low molecular weight less than about 5000. Examples of suitable monomers include, but are not limited to, t-butyl acrylate, lauryl acrylate, the acrylate and methacrylate mono- and polyesters of alcohols and polyols such as alkanols, e.g., 1,4-butanediol diacrylate, 2,2,4-trimethyl-1,3 pentanediol dimethacrylate, and 2,2-dimethylolpropane diacrylate; alkylene glycols, e.g., tripropylene glycol diacrylate, butylene glycol dimethacrylate, hexamethylene glycol diacrylate, and hexamethylene glycol dimethacrylate; trimethylol propane; ethoxylated trimethylol propane; pentaerythritol, e.g., pentaerythritol triacrylate; dipentaerythritol; and the like. Other examples of suitable monomers include acrylate and methacrylate derivatives of isocyanates, esters, epoxides and the like, such as decamethylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, and 1-phenyl ethylene-1,2-dimethacrylate. Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. It is preferred that the monomer be present in at least an amount of 5% by weight of the photopolymerizable layer.

The photoinitiator can be any single compound or combination of compounds which is sensitive to actinic radiation, generating free radicals which initiate the polymerization of the monomer or monomers without excessive termination. The photoinitiator is generally sensitive to visible or ultraviolet radiation, preferably ultraviolet radiation. Preferably, the photoinitiator should be thermally inactive at and below 185° C. Examples of suitable photoinitiators include the substituted and unsubstituted polynuclear quinones. Examples of suitable systems have been disclosed in Gruetzmacher, U.S. Pat. No. 4,460,675 and Feinberg et al., U.S. Pat. No. 4,894,315. Photoinitiators are generally present in amounts from 0.001% to 10.0% based on the weight of the photopolymerizable composition.

The photopolymerizable layer can contain other additives depending on the final properties desired. Such additives include sensitizers, plasticizers, rheology modifiers, thermal polymerization inhibitors, tackifiers, colorants, antioxidants, antiozonants, or fillers.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; liquid polyisoprene; polystyrene; poly-alpha-methyl styrene; alpha-methylstyrene-vinyltoluene copolymers; pentaerythritol ester of hydrogenated rosin; polyterpene resins; and ester resins. Generally, plasticizers are liquids having molecular weights of less than about 5000, but can have molecular weights upto about 30,000. Plasticizers having low molecular weight will encompass molecular weights less than about 30,000.

The thickness of the photopolymerizable layer can vary over a wide range depending upon the type of printing plate desired. For so called "thin plates" the photopolymerizable layer can be from about 20 to 67 mils (0.05 to 0.17 cm) in thickness. Thicker plates will have a photopolymerizable layer up to 100–250 mils (0.25 to 0.64 cm) in thickness or greater.

Preparation of the Photopolymerizable Composition

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered.

Process for Preparing a Cylindrical Flexographic Printing Plate or Form from the Photopolymerizable Element formed A first step in the process of preparing a cylindrical flexographic printing plate is to overall expose the photosensitive element to actinic radiation through a mask, that is imagewise exposure of the element. The type of radiation used is dependent on the type of photoinitiator in the photopolymerizable layer. The mask can be a phototool film (e.g., negative) as is conventional in the art, or can be provided in-situ by laser ablation of an infrared sentitive coating on the photopolymerizable layer as is described in U.S. Pat. No. 5,262,275. The mask can also be formed in-situ as described by Chambers et al. in U.S. Pat. No. 4,429,027 and by Felton et al. in European publication EP 568 841. In the phototool, dark areas of the image prevent the photopolymerizable material beneath from being exposed to the radiation and hence those areas covered by the dark areas of the phototool do not polymerize. The "clear" areas of the phototool are exposed to actinic radiation and polymerize. Similarly, the radiation-opaque material in the infrared sensitive layer which remains on top of the photopolymerizable layer prevents the material beneath from being exposed to the radiation and hence those areas covered by the radiation-opaque material do not polymerize. The areas not covered by the radiation-opaque material are exposed to actinic radiation and polymerize. Any conventional sources of actinic radiation can be used for this exposure step. Examples of suitable visible or UV sources include carbon arcs, mercury-vapor arcs, fluorescent lamps, electron flash units, electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

The actinic radiation exposure time can vary from a few seconds to minutes, depending upon the intensity and spectral energy distribution of the radiation, its distance from the photosensitive element, and the nature and amount of the photopolymerizable composition. Typically a mercury vapor arc or a sunlamp is used at a distance of about 1.5 to about 60 inches (3.8 to 153 cm) from the photosensitive element. Exposure temperatures are preferably ambient or slightly higher, i.e., about 20° C. to about 35° C.

Conventionally, imagewise exposure of the photosensitive element to actinic radiation is conducted in a vacuum eliminating the presence of atmospheric oxygen. The exposure is conducted in a vacuum to assure intimate contact between the phototool (e.g., negative) and the surface of the photopolymerizable layer and to prevent oxygen from detrimentally affecting the polymerization reactions occuring in the photopolymer layer. In the process of preparing a flexographic printing plate, the overall exposure step can be conducted in a vacuum or can be conducted outside of a vacuum, i.e., while the photosensitive element is in the presence of atmospheric oxygen. It is contemplated that a device to assure intimate contact of the phototool to the surface of a rotary cylinder for gravure applications could be used in the present instance to assure contact of the phototool to the cylindrical surface of the photoploymerizable layer.

The process of the invention usually includes a back exposure or backflash step. This is a blanket exposure to actinic radiation through the support. It is used to create a shallow layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. It is preferred that it take place just prior to the imagewise exposure to actinic radiation of the element.

Any of the conventional radiation sources discussed above can be used for the backflash exposure step. Exposure times generally range from a few seconds up to a few minutes.

Following overall exposure to actinic radiation through the mask, the element is treated by washing with a suitable developer. The treating step removes at least the photopolymerizable layer in the areas which were not exposed to actinic radiation, i.e., the non-photopolymerized areas of the photopolymer layer, and if present, the infrared-sensitive layer which was not removed during the ablation step. Development is usually carried out at about room temperature. The developers can be organic solutions, water, aqueous or semi-aqueous solutions. The choice of the developer will depend on the chemical nature of the photopolymerizable material to be removed. Suitable organic solution developers include aromatic or aliphatic hydrocarbon and aliphatic or aromatic halohydrocarbon solutions, or mixtures of such solutions with suitable alcohols. Other organic solution developers have been disclosed in published German Application 38 28 551 and in U.S. Pat. No. 5,354,645. Suitable semi-aqueous developers usually contain water and a water miscible organic solution and an alkaline material. Suitable aqueous developers usually contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. However, washout is frequently carried out in an automatic processing unit which uses developer and mechanical brushing action to removed the unexposed portions of the plate, leaving a relief constituting the exposed image and the floor.

Following solution development, the relief printing plates are generally blotted or wiped dry, and then dried in a forced air or infrared oven. Drying times and temperatures may vary, however, typically the plate is dried for 60 to 120 minutes at 60° C. High temperatures are not recommended because the support can shrink and this can cause registration problems.

Most flexographic printing plates are uniformly post-exposed to ensure that the photopolymerization process is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher et al., U.S. Pat. No. 4,427,749, U.S. Pat. No. 4,400,459, Fickes et al., U.S. Pat. No. 4,400,460 and German Patent 28 23 300. Detackification can also be accomplished by exposure to radiation sources having a wavelength not longer than 300 nm, as disclosed in European Published Patent Application 0 017927 and Gibson U.S. Pat. No. 4,806,506.

It should be understood that at present there may not be readily available commercial apparatuses for exposing, processing and finishing a cylindrical photopolymerizable element 102,202 formed from the instant method and apparatus 100,200. However, it is within the skill in the art to develop such apparatuses suitable for the purposes of handling the cylindrically formed element 102,202 given the requirements for each of the steps as disclosed herein. For example, in overall exposing, processing, post-exposing and detackifying steps, exisiting apparatuses can be modified or new apparatuses developed so that the cylindrical element 102, 202 can be mounted on a drum or cylinder, or the cylindrical element 102,202 on the sleeve 104,204 can support itself with the use of a cone at each of its ends, during these steps. While it would be understood that for the backflash exposing step, a drum may not be suitable to support the element 102,202 unless the drum is transparent to actinic radiation. Examples of circular exposing devices are disclosed in U.S. Pat. No. 3,531,200 and German preliminary published application DT 2 603 082.

THE FLEXIBLE SLEEVE

The sleeve supports the photopolymerizable layer and provides the cylindrical element with the capability to be readily and repeatably mounted and dismounted from printing cylinders. The sleeve must be able to grip the print cylinder without slippage, i.e., elastically expandable diametrically. Typically an interference fit with the print cylinder of 3 to 15 mils is preferred. The sleeves should be expandable with the 40 to 100 psig air generally available in printing facilities and should expand sufficiently so they are easily slid over the print cylinder, so that an expansion exceeding the amount of interference fit is required. The sleeve should have an outer surface free from irregularities that cause printing defects and have a uniform wall thickness which results in a difference in diameter (i.e., trueness) of the outer wall surface when mounted on the print cylinder of less than 5 mils and preferably less than 1 mil.

The sleeve can be made of any flexible material which is conventionally used as a support for photosensitive elements used to prepare flexographic printing plates. Examples of suitable support materials include polymeric films, such as those formed by addition polymers and linear condensation polymers; foams and fabrics, such as fiberglass; and metals such as nickel and aluminum. Other flexible materials suitable for use as a sleeve include polystyrene and polyvinyl resins, such as, polyvinyl chloride and polyvinyl acetate. A preferred material for use as a sleeve is a polyester film; particularly preferred is polyethylene terephthalate. The sleeve may be formed from single layer or multiple layers of flexible material provided that the sleeve has the above described characteristics. Multiple layered sleeves may include an adhesive layer or tape between the layers of flexible material. Preferred is a multiple layered sleeve as disclosed in U.S. Pat. No. 5,301,610. The sleeve typically has a wall thickness from 10 to 80 mils (0.025 to 0.203 cm) or more.

The outer surface of the sleeve, particularly when formed from a polymeric film, may optionally bear a subbing layer of an adhesive material or primer. In addition, the sleeve may be flame-treated or electron-treated, e.g., corona-treated.

INDUSTRIAL APPLICABILITY

Cylindrical photopolymerizable elements can be used to particular advantage in the formation of seamless, continuous printing relief forms. Continuous printing relief forms have applications in the flexographic printing of continuous designs such as in wallpaper, decoration and gift wrapping paper.

Furthermore, such cylindrical photopolymerizable elements are well-suited for mounting on conventional rotating drum mounted equipment. Thus, imagewise exposure, overall exposure, development and any additional process steps can be performed while the element is in cylindrical form. Conducting exposure and processing steps with a cylindrical element may provide additional advantages including increased process speed, better registration and reduced, or in some cases no extra mounting time, reduced press-ready time, and increased press printing speed. In particular, the cylindrical photopolymerizable element is well-suited for mounting on conventional laser exposure equipment in which the element can be mounted directly into the laser exposure equipment functioning as a drum during a laser exposure step. Exposure by a laser offers additional advantages of digitally imaging the cylindrical photopolymerizable element by laser ablation of an infrared sensitive coating on the element as disclosed by Fan, in U.S. Pat. No. 5,262,275, or by laser engraving of the element as disclosed by Cushner et al. in International Publications WO 93/23252 and WO 93/23253.

In addition, the continuous photopolymerizable element prepared by the process of this invention can be overall exposed to actinic radiation to polymerize the photopolymerizable layer, and the resulting element can be used as a thick sleeve or a sleeve with a cushion layer. Such a thick sleeve or cushioned element is useful for supporting another photopolymerizable layer or a relief plate in certain printing applications.

EXAMPLES

This invention will now be illustrated by the following specific examples. All parts and percentages are by weight unless otherwise indicated.

Example 1

The following example demonstrates the process of preparing a seamless cylindrical printing relief form from a photopolymerizable layer (sheet) of a flexographic printing element using an apparatus as described in the Description of the Preferred Embodiment(s).

Apparatus

The apparatus included a mandrel and three calender rolls. The mandrel had 3 rows of 7 openings drilled at an angle and equally spaced to allow air to the circumferential surface of the mandrel to facilitate the movement of a sleeve or a sleeve having a photopolymerizable layer thereto, on and off of the mandrel. The three calender rolls were made of 316 stainless steel each having a layer of Silverstone® protective coating to provide a release surface on the calender rolls. The calender rolls were skewed 1.5 degrees relative to the mandrel. The apparatus had the following start-up conditions.

The temperature of the calender rolls was 250 to 265° F. (121.1 to 129.4° C.). The calender rolls rotated at 22.2 rpm. The gap between the surface of the calender rolls and the circumferencial surface of the mandrel was about 107 mils (0.272 centimeters) when the calender rolls were in position close to the mandrel for calendering of the photopolymerizable layer. Air was being sent to the mandrel openings. The mandrel was unlocked and was permitted to rotate.

Process to Prepare A Cylindrical Photopolymerizable Element

A polyester sleeve, commercially available as Cyrel® Print Sleeve, made by E. I. du Pont de Nemours and Company (Wilmington, Del.) was used. The polyester sleeve was transparent to actinic light. The sleeve had an axial length of 12 in. (30.5 cm), a wall thickness of 40 mils (0.10 cm) and an inside diameter of 3.521 in. (8.9 cm). The sleeve was inserted on the mandrel. The air to the mandrel was turned off.

A Cyrel® flexographic printing element, type 134HORB, was used as the photopolymerizable layer. The thickness of the photopolymerizable layer was 134 mils (0.34 cm). The element included a coversheet, a release layer on both sides of the photopolymerizable layer, and a support, all of which were removed from the element. A 6 by 10 inch (15.3 by 25.4 cm) sheet of the photopolymerizable layer was used. The size of the sheet was such that it provided enough material to cover the polyester sleeve and to build a polymer bank with the calender rolls yet not too much to cause melted, calendered polymer to spread beyond the ends of the sleeve.

The photopolymerizable sheet was centered on the axial length of the sleeve with an end of the sheet close to a nip between one of the calender rolls and sleeve on the mandrel. Since the thickness of the photopolymerizable sheet was thicker than the gap setting, the photopolymerizable sheet was caught by the rotating calender rolls and the mandrel (with the sleeve secured to its surface) began rotating in a direction opposite to the rotation direction of the calender rolls.

The photopolymeric layer was rotated for about 3 minutes between the calender rolls and the mandrel with the sleeve on its surface to heat, soften, melt, spread, and calender the photopolymerizable layer. During this time, the sheet of photopolymerizable layer wrapped around the sleeve on the mandrel and a leading end of the sheet contacted to mate with a trailing end of the sheet.

The rotation of the calender rolls was increased to 32.4 rpm for about 2 minutes to improve the spreading and calendering of the photopolymerizable layer and to polish a surface of the photopolymerizable layer contacting the calender rolls. The rotation of the calender rolls continued until there was no additional spreading of the photopolymerizable layer and no polymer banks. Polymer banks appear as thick lines on the contacting surface of the photopolymerizable layer which are parallel to the calender rolls. In this example, polymer banks would appear as three thick lines on the surface of the photopolymerizable layer. To verify that there were no polymer banks, the gap between the calender rolls and the mandrel was opened, i.e., the calender rolls were positioned away from the mandrel, and the surface of the photopolymerizable layer was inspected.

The photopolymerizable layer adhered to the sleeve, and formed a cylindrical photopolymerizable element. The cylindrical photopolymerizable printing element had a glossy, smooth and seamless photopolymerizable layer except at the two side edges of the element due to thinning of the photopolymer at the sides. The total thickness of the sleeve and photopolymerizable layer on the sleeve was 107 mil (0.27 cm). The air to the mandrel was turned on, the calendering rolls were moved away from the mandrel, nd the element was removed from the mandrel.

The element was cooled to room temperature. An outer surface of the photopolymerizable layer of the element was spray coated with a composition of Macromelt® 6900 polyamide in toluene/alcohol solvent to form a release layer on the photopolymerizable layer. The element was spray coated by placing the cylindrical element on a lathe which was modified to support the element and manually moving a spray head while the lathe was rotating the element. After the release layer was room dried, both side edges of the sleeve were cut, to provide a 7 inch (17.8 cm) wide (axial length) element.

Process to Make A Cylindrical Flexographic Printing Form from The Photopolymerizable Element The element resulting from above was processed in-the-round to prepare a cylindrical flexographic relief form as follows.

Apparatuses

An experimental internal in-the-round exposure unit was used to backflash the element through the sleeve. The element was supported vertically on an end inside the internal exposure unit. The internal exposure unit included two cones spaced apart from each other to support each end of the cylindrical element vertically. One of the cones was removeable so the element could be positioned in the unit. A conventional rod lamp emitting ultraviolet radiation at about 354 nm, was centrally located on one of the cones, so that the supported element surrounded the lamp. The cones rotated the element about the lamp when the lamp was on.

An experimental external in-the-round exposure unit was used to main expose (imagewise), post-expose, and light finish the cylindrical element. The external exposure unit was similar to the internal exposure unit described above except that instead of the centrally located lamp there were two sets of multiple lamps surrounding the outside periphery of the cylindrical element. The first set of multiple lamps were conventional rod lamps emitting ultraviolet radiation at about 354 nm, surrounding the supported element. The first set of multiple lamps were used for the main exposure and the post exposure steps. The second set of multiple lamps were conventional rod lamps emitting radiation less than 300 nm, surrounding the supported element. The second set of multiple lamps were used for light finishing (detackifing) the element. Each of the lamps of the first set of lamps was spaced apart at the same distance from the outside periphery of the element. Similarly, each of the lamps of the second set of lamps was spaced apart at the same distance from the outside periphery of the element, but at a different distance from the outside periphery than the first set of lamps. Hereto, the cones rotated the element during exposure by the sets of lamps. Typically, the post-exposure and light finishing steps were done at the same time since both the first set of lamps and the second set of lamps could be on at the same time.

An experimental in-the-round processor was used to washout the areas which were not exposed to actinic light, i.e., non-photopolymerized areas, of the element. The experimental processor was substantially a smaller version of a conventional rotary washout processor with an exception. Instead of a drum as used in conventional equipment to support a photopolymer plate, two spaced cones were used to support the ends of the cylindrical element in a horizontal orientation. One of the cones adjusted position to accomodate the insertion and removal of the element into the processor. The cones rotated the element while two brush-covered rollers rotated in contact with the outside periphery surface of the element.

Process

The element was backflash exposed for 2 minutes using the experimental internal in-the-round exposure unit described above. An opaque film (goldenrod sold by Pitman Co.), used to prevent light scattering during imagewise exposure, was inserted inside the cylindrical element and placed adjacent to the sleeve on an inner circumference of the element. Two masks each having a target image were taped to the release layer on the outside periphery surface (outside circumference) of the photopolymerizable element. An area between the two masks of about 0.5 inch (1.3 cm) wide about midway along the axial length of the element was not covered by either of the two masks.

The element with masks was exposed through the targets, i.e., imagewise, with ultraviolet light for 30 minutes using the first set of lamps in the experimental external in-the-round exposure unit described above. The goldenrod film was removed.

The exposed element was processed in the experimental in-the-round processor described above. The element was processed in the experimental processor using Optisol® developer solvent for 9 minutes and wiped dry with lint-free cloth. The exposed and developed element was dried in an oven for 1 hour at 60° C. The dried element was post-exposed and post finished (detackified) for 15 minutes using the same external in-the-round exposure unit as described above. Both the first set of lamps and the second set of lamps were used at the same time.

The resulting cylindrical flexographic relief form exhibited good adhesion of the photopolymer layer to the sleeve. Also, the photopolymer layer was photosensitive having a continuous middle solid and 10 to 90% tonal range at 150 lpi The cylindrical relief form was used to print on paper on a Mark Andy Press. The cylindrical relief form was mounted on an air-assisted cylinder of the press and using 93 gear tooth to adjust the meeting of the relief form to an impression roller of the press. The printing was done on high gloss paper from Fasson (Painsville, Ohio) using aqueous black ink (EIC film III Dense Black, EC 9630) from Environmental Inks and Coatings (Morgan, N.C.) with 27 sec. Zahn cup #2, at 100 foot-per-minute web speed. The cylindrical relief form demonstrated continuous print capability as shown in the middle solid area and printed the tonal range of 10–90% at 150 lpi.

Example 2

The following example demonstrates the process preparing a seamless cylindrical printing relief form from a photopolymerizable layer (sheet) of a flexographic printing element using an apparatus as described in the Description of the Preferred Embodiment(s).

A cylindrical flexographic relief form was made from the same photopolymerizable layer and with the apparatus set-up and operated as described in Example 1 with the exception that the sleeve moved axially on the mandrel after the photopolymerizable layer was calendered on the sleeve. The mandrel was in unlocked position, air was sent to the mandrel and the sleeve inserted. The air was turned off. The photopolymerizable layer was rotated between the calender rolls and the sleeve on the mandrel. After the majority of the photopolymerizable layer had a smooth even surface, the air was turned on and the mandrel was in locked position. The element, i.e., sleeve and photopolymerizable layer, moved helically, i.e., rotationally and axially towards the exit end of the apparatus due to the cushion of air between the sleeve and the mandrel and the skewed angle of the calender rolls. A good seamless cylindrical photopolymerizable element was demonstrated. The element was subsequently backflash and imagewise exposed and processed in-the-round as described in Example 1. The cylindrical relief form was used to print on the press and resulted in similar printing quality.

Example 3

The following example demonstrates the process of preparing a seamless cylindrical printing relief form from a photopolymerizable hot melt composition using an apparatus as described in the Description of the Preferred Embodiment(s).

The apparatus was set-up and operated as described in Example 2 with the following changes. The temperature of the calender rolls was 250° F. The calender rolls were in position close to the mandrel for calendering the photopolymerizable molten stream with a gap between the mandrel and the calender rolls of 107 mils (0.27 cm). The calender rolls were rotating at 27 rpm. The mandrel was locked into position preventing rotation. The air to the mandrel was on. A 40 mil (0.10 cm) thickness polyester sleeve which was 20 inches long as described in Example 1 was inserted onto the mandrel, so that an end of the sleeve last on the mandrel (exit was all the way to a drive side of the apparatus and beyond the calender rolls).

A twin screw extruder, (made by Werner & Pfleiderer) was used to extrude photopolymerizable hot melt to the above calendering apparatus. The extruder did not use a die. Instead, the hot melt polymer extruded from an outlet ⅜ in. (0.95 cm) diameter in noodle form. The ingredients for the photopolymerizable hot melt were fed into the extruder.

The photopolymerizable hot melt was composed of the following ingredients wherein all percentages are by weight, unless otherwise indicated.

| | | |
|---|---|---|
| Kraton ® 1102 | Polystyrene-polybutadiene-polystyrene (from Shell Chemical Co., Houston, TX) | 58.3 |
| Nisso PB-1000 | 1,2-polybutadiene (from Nippon Soda Co., Tokyo, Japan) | 13.9 |
| Polyoil 130 | Liquid polybutadiene oil (from Huels Corp., NY) | 14.6 |
| HMDA | 1,6-hexamethylenediol diacrylate | 10.0 |
| BHT | Butyrated hydroxy toluene (from Sherwin Williams) | 1.0 |
| Irgacure ® 651 | 2,2-dimethoxy-2-phenylacetophenone (from Ciba-Geigy, Hawthorne, NY) | 2.0 |
| HEMA | Hydroxethylmethacrylate (Rohm and Haas) | 0.234 |
| Red Dye 346 | Neozapon red dye (from BASF Wyandotte Corp. Holland, MI) | 0.006 |

With the sleeve being rotated on the mandrel manually, the hot melt was extruded in noodle form from the outlet onto the sleeve. The extruder was positioned such that an outlet of the extruder fed the hot melt onto the sleeve on the mandrel adjacent to a calender roll of the apparatus. The polymer was extruded at 10 lbs/hr (4.54 kg/hr) at a temperature of about 120° C. Once the gap between the sleeve and the calender rolls was filled with the photopolymerizable hot melt, the coated sleeve turned on its own and manual rotation was no longer required. The air was on during the run to allow easy turning and advancing of the sleeve towards the exit end of the apparatus. The coated sleeve was traveling at an axial advancing rate of about 6 inches per minute (15.24 cm/min) taking about 3 minutes to coat 18 inches (45.7) of the sleeve and form the element.

A good seamless, continuous cylindrical photopolymerizable element was obtained. A "barber pole" or spiral winding appearance was observed in the resulting photopolymerizable layer on the sleeve. This element was spray coated with a polyamide release layer as described in Example 1.

The resulting element was backflashed, imagewise exposed, developed, dried and post-treated as described in Example 1. Good relief images were obtained. No defects (solid or dots) were observed due to the "barber pole" appearance.

The cylindrical flexographic printing form was used to print on the Mark Andy press as described in Example 1. The press sheet did not exhibit any defects relating to the "barber pole" appearance. Apparently, this appearance is only an optical effect. Seamless printing was obtained as desired.

Example 4

The following example demonstrates the process of preparing a seamless cylindrical printing relief form from a photopolymerizable hot melt composition different from that described in Example 3, using an apparatus as described in the Description of the Preferred Embodiment(s).

The apparatus was set-up and operated as described in Example 3 with the following changes. The temperature of the calender rolls was 275° F. (135° C.). The calender rolls were rotated at 28.6 rpm and the photopolymerizable hot melt feed rate from the extruder was 12 lb/hr (5.4 kg/hr).

The photopolymerizable hot melt was composed of the following ingredients wherein all percentages are by weight, unless otherwise indicated.

| | | |
|---|---|---|
| Kraton ® 2105 | Polystyrene-polybutadiene-polystyrene block copolymer (from Shell Chemical Co., Houston, TX). | 61.5 |
| Cariflex DX-1000 | Styrene/butadiene diblock elastomer (from Shell Chem.) | 10.5 |
| HMDA | 1,6-hexamethylenediol diacrylate | 6.5 |
| HEMA | Hydroxethylmethacrylate (Rohm and Haas) | 0.23 |
| Polyoil | 1,4-polybutadiene, Molecular weight 3000 (from Huels Corp., NY) | 18.8 |
| Irgacure ® 651 | 2,2-dimethoxy-2-phenylacetophenone (from Ciba-Geigy, Hawthorne, NY) | 1.41 |
| BHT | Butylated hydroxytoluene (from Sherwin Williams) | 0.50 |
| Red Dye 335 | Neozapon red dye (from BASF Wyandotte Corp. Holland, MI) | 0.006 |
| TAOBN ® | 1,4,4-trimethyl-2,3-diazobicyclo (3.2.2) non-2-ene-2,3-dioxide | 0.024 |

The resulting cylindrical photopolymerizable element also had "barber pole" or "spiral winding" appearance. The element was backflash and imagewise exposed, processed and printed as described in Example 3. The barber pole appearance did not cause problems in photoimaging and printing steps and seamless printing was demonstrated.

Example 5a

The following examples 5a and 5b, demonstrate the process of preparing a cylindrical flexographic element from a photopolymerizable hot melt composition of Example 3 using the apparatus as described in the prior Examples which had been modified to use less than three calender rolls.

Example 3 was repeated except that only two calender rolls were used to calender the photopolymerizable hot melt. One of the three calender rolls remained in the open position when the other two calender rolls were positioned close to the mandrel at the gap setting. A good seamless cylindrical photopolymerizable element was successfully made.

Example 5b

Example 3 was repeated except that only one calender rolls was used to calender the photopolymerizable hot melt. Two of the three calender rolls remained in the open position when the other one calender roll was positioned close to the mandrel at the gap setting. A good seamless cylindrical photopolymerizable element was successfully made.

Example 6

Example 3 was repeated to demonstrate the process of preparing cylindrical photopolymerizable element having a thick photopolymerizable layer from a photopolymerizable hot melt composition.

The apparatus was set-up and operated as described in Example 3 with the following changes. The temperature of the calender rolls was 225° F. (107° C.). The hot melt was extruded at a feed rate of 20 lb/hr (9.1 kg/hr). The calender rolls to mandrel were positioned at the gap setting of 165 mils (0.42 cm) (closed position) just prior to the feeding of the hot melt. A polymer ring (about one inch wide and 125 mil thickness (0.32 cm)) was placed at the end of the sleeve closest to the exit end of the apparatus while on the mandrel. The polymer ring provided contact between the calender rolls and the sleeve so that initially the sleeve would rotate without manual operation. The calender rolls were closed just prior to the feeding of the hot polymer.

A cylindrical photopolymerizable element having a thickness of 165 mils (0.42 cm), which is the thickness of the photopolymerizable layer and the sleeve, was successfully demonstrated.

Example 7

The following example demonstrates the process of preparing a cylindrical photopolymerizable element from a photopolymerizable hot melt composition different from that described in Examples 3 and 4.

The apparatus set-up and operation were the same as described in Example 3 except that the hot melt feed rate from the extruder was 20 lb/hr (9.1 kg/hr) and the temperature of the calender rolls was 275° F. (135° C.). The gap between the calender rolls and the mandrel was 165 mil (0.42 cm).

The photopolymerizable hot melt was composed of the following ingredients wherein all percentages are by weight, unless otherwise indicated.

| Kraton ® 1107 | Linear styrene-isoprene-styrene block copolymer (from Shell Chemical Co.) | 72.64 |
| --- | --- | --- |
| LIR 30 | Liquid polyisoprene (from Kuraray Chemical Co., Tokyo, Japan) | 7.9 |
| Piccotex ® 100S | Substituted polystyrene | 5.79 |
| Ceresin Wax | Hydrocarbon wax | 0.97 |
| HMDA | 1,6-hexamethylenediol diacrylate | 5.09 |
| HMDMA | 1,6-hexamethylenediol diacrylate | 3.57 |
| HEMA | Hydroxethylmethacrylate | 0.17 |
| Reddye | Neozapon ® red dye | 0.004 |
| Irgacure ® 651 | 2,2-dimethoxy-2-phenylacetophenone | 1.94 |
| BHT | Butyrated hydroxy toluene | 1.92 |

A cylindrical photopolymerizable element having a thickness of 165 mils (0.42 cm), which is the thickness of the photopolymerizable layer and the sleeve, was successfully demonstrated.

Example 8a

The following examples 8a and 8b demonstrate the process of preparing a cylindrical photopolymerizable element from a photopolymerizable hot melt composition having multiple photopolymerizable layers using an apparatus as described in the Description of the Preferred Embodiment(s).

A cylindrical photopolymerizable element of 107 mil (0.27 cm) (including the thickness of the sleeve) was made according to Example 3.

A second phtopolymerizable layer was formed on the element by modifying the apparatus as follows. The apparatus set-up and operation was the same as Example 3 except that the temperature of the calender rolls was 275° F. (135° C.) and the calender rolls rotated at 25.4 rpm. The element was inserted onto the mandrel while air was sent to the mandrel. The gap between the calender rolls and the mandrel was set at 165 mil (0.42 cm). The hot melt composition of Example 7 was extruded in noodle form onto the previously formed cylindrical photopolymerizable layer. The second photopolymerizable layer was a different composition than the first photopolymerizable layer.

A good cylindrical photopolymerizable element having multiple photopolymerizable layers was successfully made.

Example 8b

Example 8a was repeated except that the cylindrical photopolymerizable element made according to Example 3 was given an overall exposure to ultraviolet light for 15 minutes before inserting the element onto the mandrel. The hot melt composition of Example 7 was extruded onto the exposed element as described in Example 8a.

A good cylindrical photopolymerizable element having a photopolymerizable layer on an exposed photopolymer layer was successfully made.

What is claimed is:

1. A method for forming a seamless cylindrical photosensitive element on a flexible sleeve, comprising:

supplying a substantially cylindrical molten stream, or a molten or solid sheet, of photopolymerizable material onto the sleeve supported by a mandrel, said mandrel having a longitudinal axis;

calendering the molten photopolymerizable material on the sleeve by metering the photopolymerizable material to have a substantially constant thickness of the sleeve, said calendering being performed by at least one calender roll positioned to contact the photopolymerizable material on the sleeve;

moving the sleeve around and along the longitudinal axis of the mandrel in a helical fashion by rotating the calender roll while simultaneously moving the sleeve axially along the longitudinal axis of the mandrel to polish an outer circumferential surface of the element to a seamless uniform state without sanding, grinding or additional polishing apparatus, thereby forming the seamless cylindrical photosensitive element; and during the calendering step, heating the photopolymerizable material.

2. The method of claim 1, further comprising:

forming the photosensitive element to have an axial length greater than an axial length of the mandrel within a calendering assembly used to perform the calendering step.

3. The method of claim 1, further comprising:

supplying air through passages through the mandrel to an outer circumferential surface of the mandrel to facilitate movement of the sleeve axially along and rotationally about the mandrel.

4. The method of claim 1, further comprising:

prior to the supplying step, moving the sleeve axially along the mandrel to locate the sleeve at an initial position to receive the photopolymerizable material.

5. The method of claim 1, further comprising:

locking the mandrel prohibiting the mandrel from rotating.

6. The method of claim 1, wherein the moving step comprises:

rotating the at least one calendar roll having a longitudinal axis which is skewed with respect to the longitudinal axis of the mandrel such that during the supplying step when the photopolymerizable material is between the at least one calender roll and the sleeve, the photopolymerizable material translates the motion of the at least one calender roll to the sleeve thereby rotating the sleeve and axially moving the sleeve along the longitudinal axis of the mandrel.

7. The method of claim 1, wherein the moving step is performed by a linear actuator.

* * * * *